(12) United States Patent
Nemati et al.

(10) Patent No.: US 7,738,274 B1
(45) Date of Patent: Jun. 15, 2010

(54) CONTENT-ADDRESSABLE MEMORY ARCHITECTURE

(75) Inventors: Farid Nemati, Redwood City, CA (US); Bruce Lynn Bateman, Fremont, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 175 days.

(21) Appl. No.: 12/079,548

(22) Filed: Mar. 27, 2008

Related U.S. Application Data

(60) Provisional application No. 60/979,913, filed on Oct. 15, 2007.

(51) Int. Cl.
*G11C 15/00* (2006.01)

(52) U.S. Cl. .................. 365/49.1; 365/49.18; 365/115; 365/155; 365/175

(58) Field of Classification Search ............... 365/49.1, 365/49.18, 115, 155, 175
See application file for complete search history.

(56) References Cited

U.S. PATENT DOCUMENTS

| | | |
|---|---|---|
| 6,611,452 B1 | 8/2003 | Han |
| 6,721,220 B2 | 4/2004 | Yoon |
| 6,734,815 B1 | 5/2004 | Abdollahi-Alibeik |
| 6,735,113 B2 | 5/2004 | Yoon |
| 6,756,838 B1 | 6/2004 | Wu |
| 6,778,435 B1 | 8/2004 | Han |
| 6,781,888 B1 | 8/2004 | Horch |
| 6,785,169 B1 | 8/2004 | Nemati |
| 6,804,162 B1 | 10/2004 | Eldridge |
| 6,819,278 B1 | 11/2004 | Abdollahi-Alibeik |
| 6,842,360 B1 | 1/2005 | Srinivasan |
| 6,845,026 B1 * | 1/2005 | Gharia ..................... 365/49.1 |
| 6,845,037 B1 | 1/2005 | Han |
| 6,856,527 B1 | 2/2005 | Srinivasan |
| 6,885,581 B2 | 4/2005 | Nemati |
| 6,891,774 B1 | 5/2005 | Abdollahi-Alibeik |
| 6,901,021 B1 | 5/2005 | Horch |
| 6,903,987 B2 | 6/2005 | Yoon |
| 6,937,085 B1 | 8/2005 | Samaddar |
| 6,940,772 B1 | 9/2005 | Horch |
| 6,944,051 B1 | 9/2005 | Lee |
| 6,947,349 B1 | 9/2005 | Abdollahi-Alibeik |
| 6,958,931 B1 | 10/2005 | Yoon |
| 6,975,260 B1 | 12/2005 | Abdollahi-Alibeik |
| 7,006,398 B1 | 2/2006 | Yoon |

(Continued)

OTHER PUBLICATIONS

Hideyuki Noda et al, A Cost-Efficient High-Performance Dynamic TCAM With Pipelined Hierarchical Searching and Shift Redundancy Architecture, IEEE Journal of Solid-State Circuits, vol. 40, No. 1, pp. 245-253, Jan. 2005.

(Continued)

*Primary Examiner*—Thong Q Le
(74) *Attorney, Agent, or Firm*—The Webostad Firm

(57) ABSTRACT

A content-addressable memory ("CAM") architecture and method for reducing power consumption thereof are described. A CAM cell array includes CAM cells, each of which includes two thyristor-based storage elements. Each thyristor-based storage element of the CAM cells has a control gate, an anode, and a cathode for providing control gates, anodes, and cathodes of the CAM cells. The CAM cell array further includes matchlines directly coupled to the cathodes of the CAM cells; searchlines directly coupled to the anodes of the CAM cell; and gatelines coupled to the control gates of the CAM cells.

28 Claims, 29 Drawing Sheets

U.S. PATENT DOCUMENTS

| | | | |
|---|---|---|---|
| 7,019,999 | B1 | 3/2006 | Srinivasan |
| 7,042,759 | B2 | 5/2006 | Nemati |
| 7,054,191 | B1 | 5/2006 | Gupta |
| 7,064,977 | B1 | 6/2006 | Horch |
| 7,089,439 | B1 | 8/2006 | Abdollahi-Alibeik |
| 7,096,144 | B1 | 8/2006 | Bateman |
| 7,123,508 | B1 | 10/2006 | Horch |
| 7,133,302 | B1 | 11/2006 | Srinivasan |
| 7,174,419 | B1 | 2/2007 | Ichiriu |
| 7,187,530 | B2 | 3/2007 | Salling |
| 7,236,421 | B1 | 6/2007 | Eldridge |
| 7,245,525 | B1 | 7/2007 | Lee |
| 7,268,373 | B1 | 9/2007 | Gupta |
| 7,304,327 | B1 | 12/2007 | Nemati |
| 7,319,602 | B1 | 1/2008 | Srinivasan |
| 7,319,622 | B1 | 1/2008 | Roy |
| 7,324,394 | B1 | 1/2008 | Yoon |
| 2004/0004880 | A1 | 1/2004 | Yoon |
| 2004/0022109 | A1 | 2/2004 | Yoon |
| 2004/0071013 | A1 | 4/2004 | Yoon |
| 2005/0185489 | A1 | 8/2005 | Nemati |
| 2006/0011940 | A1 | 1/2006 | Nemati |
| 2006/0018183 | A1* | 1/2006 | De Sandre et al. .......... 365/232 |

OTHER PUBLICATIONS

Sungdae Choi et al, A 0.7-fJ/Bit/Search 2.2-ns Search Time Hybrid-Type TCAM Architecture, IEEE Journal of Solid-State Circuits, vol. 40, No. 1, pp. 254-260, Jan. 2005.

Chi-Sheng Lin et al, A Low-Power Precomputation-Based Fully Parallel Content-Addressable Memory, IEEE Journal of Solid-State Circuits, vol. 38, No. 4, pp. 654-662, Apr. 2003.

Kostas Pagiamtzis et al, Content-Addressable Memory (CAM) Circuits and Architectures: A Tutorial and Survey, IEEE Journal of Solid-State Circuits, vol. 41, No. 3, pp. 712-727, Mar. 2006.

Kostas Pagiamtzis et al, A Low-Power Content-Addressable Memory (CAM) Using Pipelined Hierarchical Search Scheme, IEEE Journal of Solid-State Circuits, vol. 39, No. 9, pp. 1512-1519, Sep. 2004.

Igor Arsovski et al, A Ternary Content-Addressable Memory (TCAM) Based on 4T Static Storage and Including a Current-Race Sensing Scheme, IEEE Journal of Solid-State Circuits, vol. 38, No. 1, pp. 155-158, Jan. 2003.

Gen Kasai et al, 200MHz/200MSPS 3.2W at 1.5V Vdd, 9.4Mbits Ternary CAM with New Charge Injection Match Detect Circuits and Bank Selecion Scheme, Custom Integrated Circuits Conference, 2003, Proceedings of the IEEE 2003, pp. 387-390, Sep. 21-24, 2003.

* cited by examiner

CONTENT-ADDRESSABLE MEMORY ARCHITECTURE

CROSS-REFERENCE TO RELATED APPLICATIONS

This application claims benefit to U.S. provisional patent application No. 60/979,913, filed Oct. 15, 2007, entitled "Thyristor Based Ternary Content Addressable Memory" by Farid Nemati (an inventor hereof), which is incorporated herein by reference in its entirety. This application is related to the following co-pending United States patent applications: application Ser. No. 11/881,159, entitled "Thyristor Based Memory Cell," filed Jul. 25, 2007; application Ser. No. 11/881,049, entitled "Thyristor Based Memory Cell," filed Jul. 25, 2007; and application Ser. No. 11/159,447, entitled "A New Thyristor Based Memory Cell and Architecture," filed Jun. 22, 2005. Each of the above-referenced co-pending related patent applications is incorporated herein by reference in its entirety.

FIELD

One or more aspects of the invention generally relate to a Content-Addressable Memory architecture.

BACKGROUND

Semiconductor memories such as static random access memory ("SRAM") and dynamic random access memory ("DRAM") are in widespread use. DRAM is very common due to its high density with a cell size typically between $6F^2$ and $8F^2$, where F is a minimum feature size. However, DRAM is relatively slow having an access time commonly near 20 nanoseconds ("ns"). Although SRAM access time is typically an order of magnitude faster than DRAM, an SRAM cell is commonly made of four transistors and two resistors or of six transistors, thus leading to a cell size of approximately $60F^2$ to $100F^2$.

Others have introduced memory designs based on a negative differential resistance ("NDR") cell, such as a thyristor cell, to minimize the size of a conventional SRAM memory. A thyristor-based random access memory ("RAM") may be effective in memory applications. Additional details regarding a thyristor-based memory cell are described in U.S. Pat. Nos. 6,767,770 B1 and 6,690,039 B1.

Charge leakage out of a thyristor-based memory cell negatively impacts the restore rate of such cell. Additional details regarding periodically pulsing a thyristor-based memory cell to restore state of such a cell may be found in Patent Cooperation Treaty ("PCT") International Publication WO 02/082504.

Content-Addressable Memory ("CAM") is conventionally used for performing searches more rapidly than other forms of memory. CAM is used in many applications where search speed is a significant performance criterion. Some of these applications include telecommunication and computer networking switches, among other applications. A survey of CAM design is disclosed in "Content-Addressable Memory (CAM) Circuits and Architectures: A Tutorial and Survey" by Kostas Pagiamtzis, et al. in the IEEE Journal of Solid-State Circuits, Vol. 41, No. 3, March 2006, pages 712-727.

A binary CAM ("BiCAM") cell may be used to compare an incoming search word in parallel against CAM stored "match" words. Each comparison of the multiple comparisons performed in parallel gives an indication of whether or not the incoming search word matches one or more of the stored match words. In some implementations, the search word will only match one of the stored match words, known as a "one-hot" configuration. In other implementations, the search word may match more than one of the stored match words. The stored match words in the CAM are compared at the bit level with the results of such bit comparisons conventionally being either ORed (e.g., looking for any bit having a mismatch) or ANDed (e.g., looking for all bits matching).

Conventionally, a BiCAM cell includes a storage element for storing a bit of a stored match word, a circuit to compare the bit contained in the storage element against a corresponding bit of a search word, and an output driver for outputting results of the comparison onto a matchline. The circuit that compares the bit contained in the storage element, namely the bit of the match word, with a corresponding bit of a search word is an XOR circuit. Furthermore, the output driver conventionally may include either of the above-described OR or AND circuitry for comparing the individual bits outputs.

A conventional BiCAM cell may employ an SRAM storage element with NOR or NAND circuitry. A NOR-type BiCAM cell conventionally includes ten transistors, and a NAND-type BiCAM cell conventionally includes nine transistors. It should be appreciated that the XOR function in each of the NOR-type BiCAM cell and the NAND-type BiCAM cell uses differential data for both the stored match word and the search word. Furthermore, the SRAM storage element provides differential data using only one storage element in such memory cell.

A Ternary CAM ("TCAM") cell is capable of representing any of three data states, namely a logic 1, a logic 0, and a "don't care" state. In a "don't care" state, a TCAM cell generates a "hit" regardless of the state of data on an associated searchline. A "hit" means a match between a search bit and a stored match bit ("match bit"). A TCAM cell allows a bit in a match word to be ignored as part of a search operation. Thus, a TCAM cell allows bit masking as part of the function of such cell, which is useful in some CAM applications.

For a NOR-type TCAM cell, the storage capability of the cell is bifurcated by using two storage elements in a TCAM cell. However, a conventional TCAM cell suffers from a substantial area penalty compared to a conventional BiCAM cell because two storage elements are used for each cell. A conventional NOR-type TCAM cell may include 14 transistors. A DRAM-based TCAM cell using 6 transistors and 2 capacitors is described in additional detail in "eDRAM-Based TCAM Cell" by Noda et al. in the IEEE Journal of Solid-State Circuits, Vol. 40, No. 1, January 2005, paged 245-253.

Others have suggested using static thyristor-based cells for CAM, as disclosed in U.S. Pat. No. 6,845,026. However, static thyristor-based cell arrays, while smaller than SRAM-based CAM arrays of equivalent capacity, are still relatively large.

As is known, conventional CAM may have significantly large power consumption. Others have considered using pre-computation to reduce CAM power consumption, as disclosed in "A Low-Power Precomputation-Based Fully Parallel Content-Addressable Memory" by Chi-Sheng Lin, et al. in the IEEE Journal of Solid-State Circuits, Vol. 38, No. 4, April 2003, pages 654-662.

BRIEF SUMMARY

One or more aspects generally relate to a content-addressable memory ("CAM") architecture.

An aspect is a CAM cell array, including CAM cells, each of which includes two thyristor-based storage elements. Each thyristor-based storage element of the CAM cells has a control gate, an anode, and a cathode for providing control gates, anodes, and cathodes of the CAM cells. The CAM cell array further includes matchlines directly coupled to the cathodes of the CAM cells; searchlines directly coupled to the anodes of the CAM cells; and gatelines coupled to the control gates of the CAM cells.

Another aspect is a CAM cell array including CAM cells, each of which includes two thyristor-based storage elements and does not include an access field effect transistor. Each thyristor-based storage element of the CAM cells has a control gate, an anode, and a cathode for providing control gates, anodes, and cathodes of the CAM cells. The CAM cell array further includes matchlines directly coupled to the anodes of CAM cells; searchlines directly coupled to the cathodes of the CAM cells; and gatelines directly coupled to the control gates of the CAM cells.

Yet another aspect is a method for reducing power consumption of a CAM cell array. CAM cells including thyristor-based storage elements respectively having control gates coupled to a gateline are obtained. Consecutive search cycles of the CAM cells are performed. During a cycle of the consecutive search cycles, a pulse is applied to the gateline for pulsing the thyristor-based storage elements coupled thereto. During a remainder of the consecutive search cycles after the cycle, the pulse is not applied.

Still yet another aspect is a memory device including a first array of first memory cells and a second array of second memory cells. Each of the first memory cells has two thyristor-based storage elements and is configured at least in part for differential operation. Each of the second memory cells has a single thyristor-based storage element and is configured for single-ended operation. The first array and the second array have matchlines in common, wherein a first portion of the first memory cells and a second portion of the second memory cells are both coupled to a same line.

Still yet another aspect is a method for reducing peak dynamic power consumption of a CAM cell array. Precompute values for match words are determined. The match words are stored in a first array of single-ended thyristor-based storage elements. The precompute values are stored in a second array of differential thyristor-based storage elements in association with the match words for correspondence between the match words and the pre-compute values to provide stored vectors. A search word is received. A precompute value for the search word is determined. The pre-compute value is appended to the search word to provide a search vector. The match words and the precompute values respectively stored in the first array and the second array are searched using the search vector. A pointer is output responsive to a match between the search vector and a stored vector of the stored vectors.

A further aspect is another memory device. This memory device includes a first array of first memory cells and a second array of second memory cells. Each of the first memory cells have two thyristor-based storage elements, where the first memory cells are configured at least in part for differential operation. Each of the second memory cells have a single thyristor-based storage element, where the second memory cells are configured for single-ended operation. The first array and the second array have a first matchline and a second matchline, respectively. Control circuitry is coupled to the first matchline for obtaining a voltage therefrom, and the control circuitry is configured to selectively precharge the second matchline responsive to the voltage obtained from the first matchline.

Still a further aspect is a method for reducing power consumption of a CAM cell array. Precompute values are determined for match words, and the match words are stored in a first array of single-ended thyristor-based storage elements. The precompute values are stored in a second array of differential thyristor-based storage elements in association with the match words for correspondence between the match words and the precompute values. A search word is received, and a precompute value for the search word is determined. The precompute values respectively stored the second array are searched using the precompute value. A match is found between the precompute value and at least one of the precompute values, and responsive to the match, a matchline associated with a match word of the match words is precharged.

The match word is associated with the at least one of the precompute values matching the precompute value.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items, however, in alternative embodiments the items may be different. Moreover, for purposes of clarity, a single signal or multiple signals may be referred to or illustratively shown as a signal to avoid encumbering the description with multiple signal lines. Moreover, along those same lines, circuit elements may be referred to or illustratively shown as a single element even though such reference or illustration may be representing multiples thereof. Furthermore, though particular operational parameters, such as voltages, are described herein for purposes of clarity by way of example, it should be understood that the scope of the description is not limited to these particular numerical examples as other values may be used. Finally, as used herein throughout, "include" and "including" shall mean to include without limitation.

Prior to a detailed description of embodiments in accordance with one or more aspects of the invention, a brief review of the prior art may be useful. Accordingly, FIGS. 1A through 1D are circuits of the prior art. With reference to FIGS. 1A, 1B, 1C, and 1D, as operation of such cells is well known, it is not described herein in unnecessary detail for purposes of clarity.

Figure 1A:
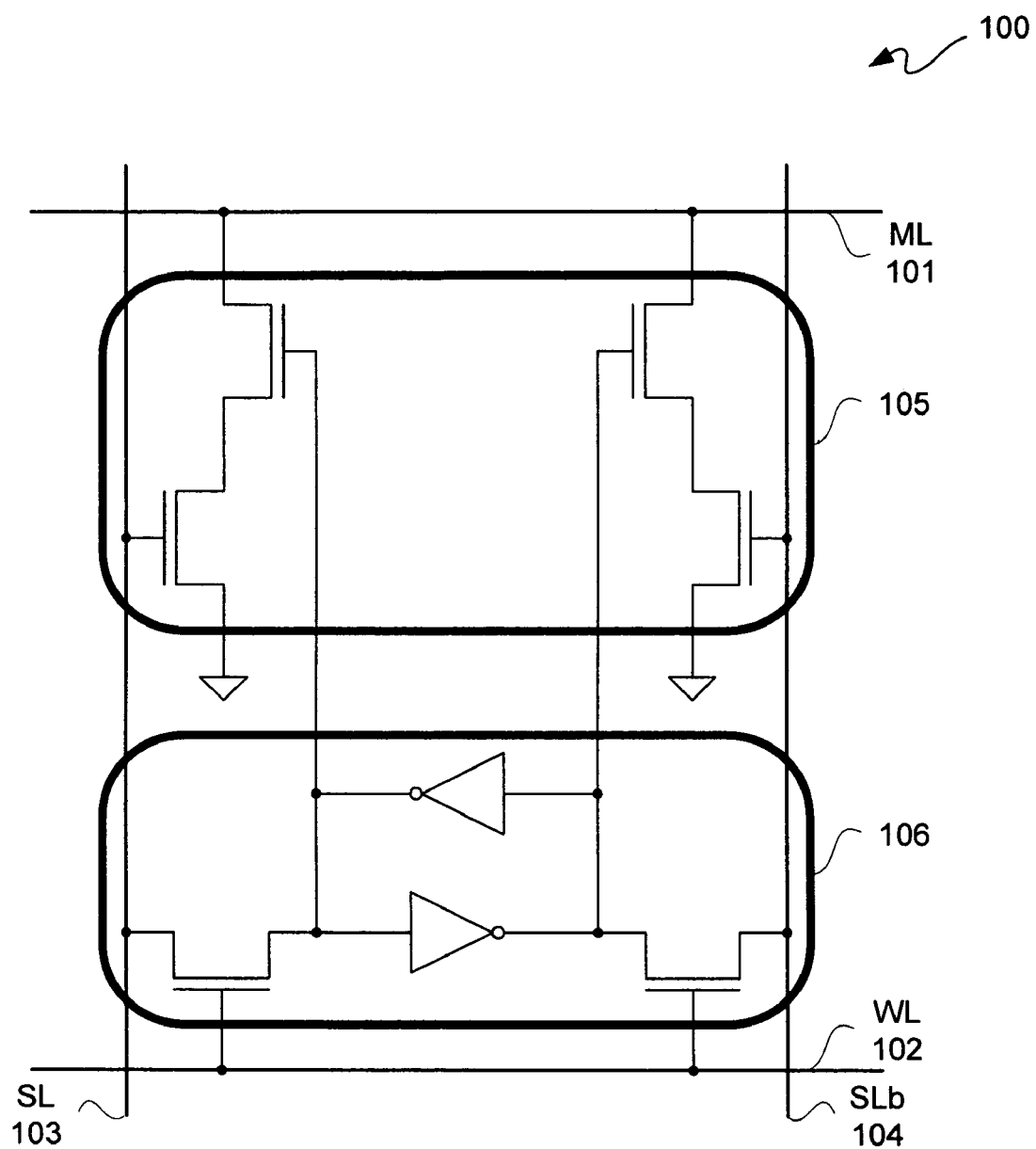
FIG. 1A is a circuit diagram depicting an exemplary embodiment of a NOR-type binary content addressable memory ("BiCAM") cell of the prior art.

FIG. 1A is a circuit diagram depicting an exemplary embodiment of a NOR-type BiCAM cell 100 of the prior art. BiCAM cell 100 is coupled to matchline ("ML") 101, word line ("WL") 102, as well as searchline ("SL") 103 and SL complement ("SLb") 104. BiCAM cell 100 includes XOR and ML driver circuit 105 and six transistors ("6T") SRAM storage element 106. As is known, the SLb 104 side of XOR and ML driver circuit 105 is for comparison with logic 0s, and the SL 103 side of XOR and ML driver circuit 105 is for comparison with logic 1s.

Figure 1B:
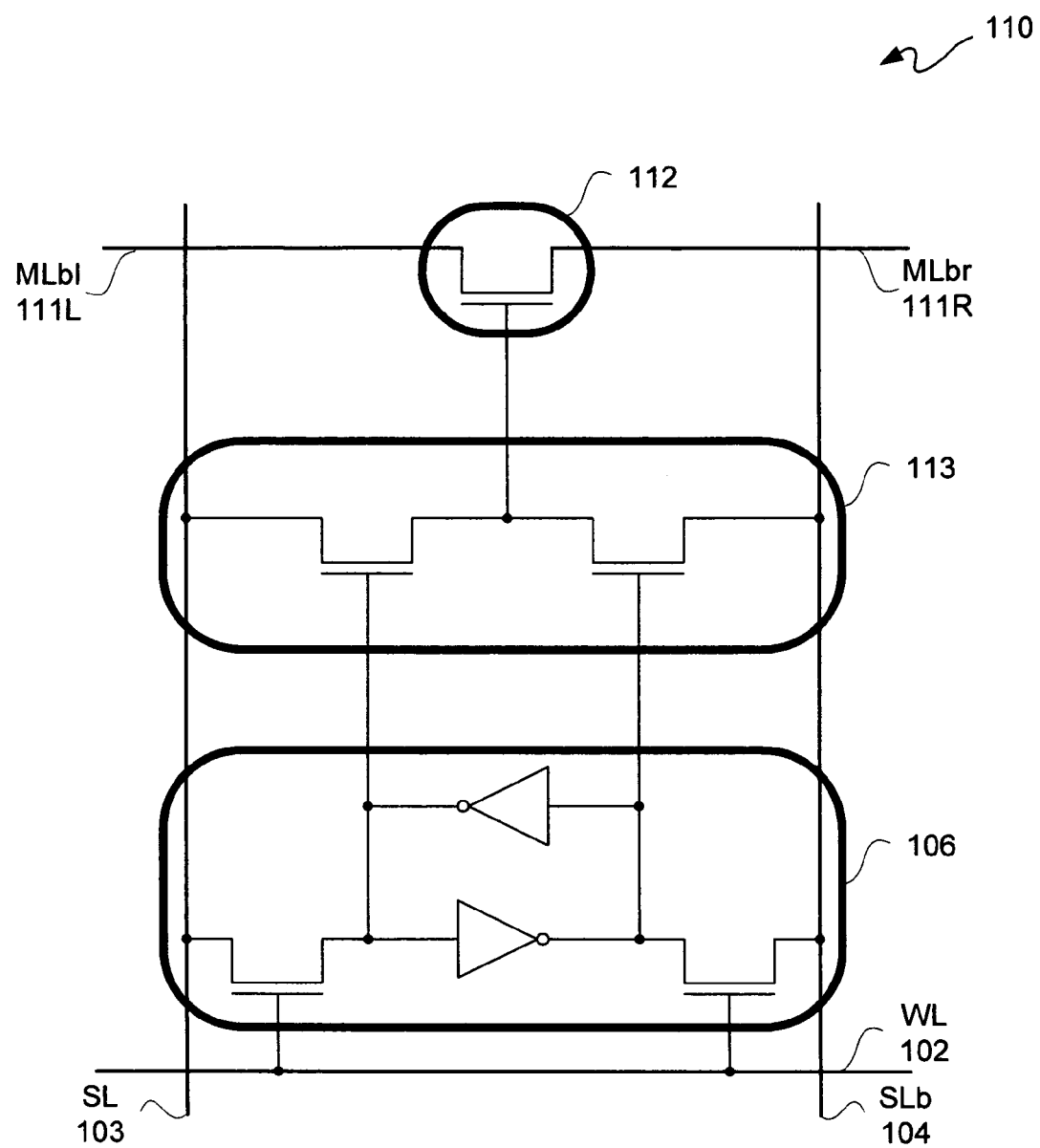
FIG. 1B is a circuit diagram depicting an exemplary embodiment of a NAND-type BiCAM cell of the prior art.

FIG. 1B is a circuit diagram depicting an exemplary embodiment of a NAND-type BiCAM cell 110 of the prior art. BiCAM cell 110 includes XOR circuit 113 and a separate ML driver circuit 112. ML driver circuit 112 is coupled to ML complement lines, namely ("MLbr") 111R on a right side and MLbl 111L on a left side, and is gated by signaling sourced from XOR circuit 113. BiCAM cell 110 also includes 6T SRAM storage element 106. BiCAM cell 110 is coupled to SL 103 and SLb 104, as well as WL 102, MLbl 111L, and MLbr 111R.

Figure 1C:
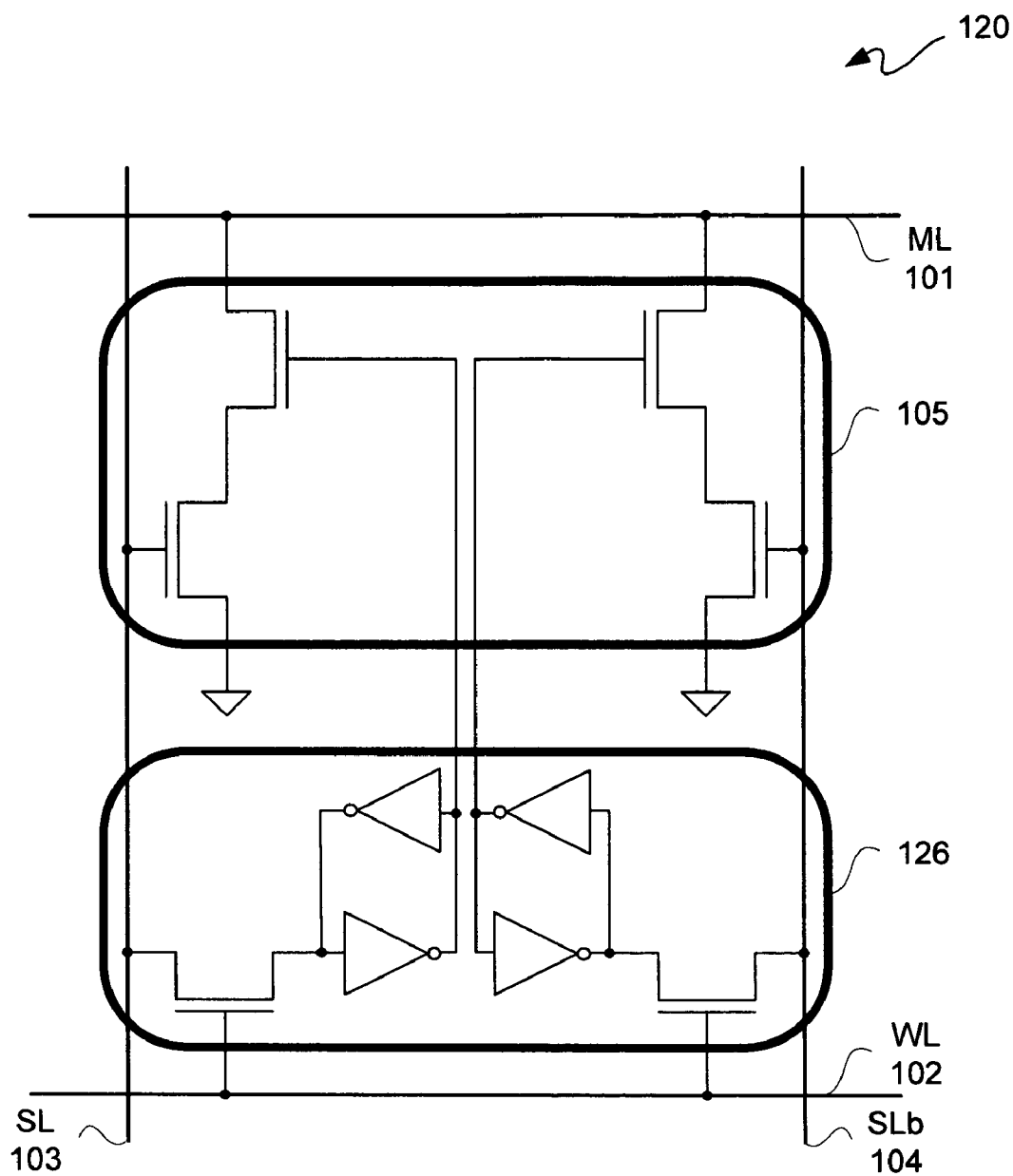
FIG. 1C is a circuit diagram depicting an exemplary embodiment of a NOR-type ternary CAM ("TCAM") cell of the prior art.
Figure 1D:
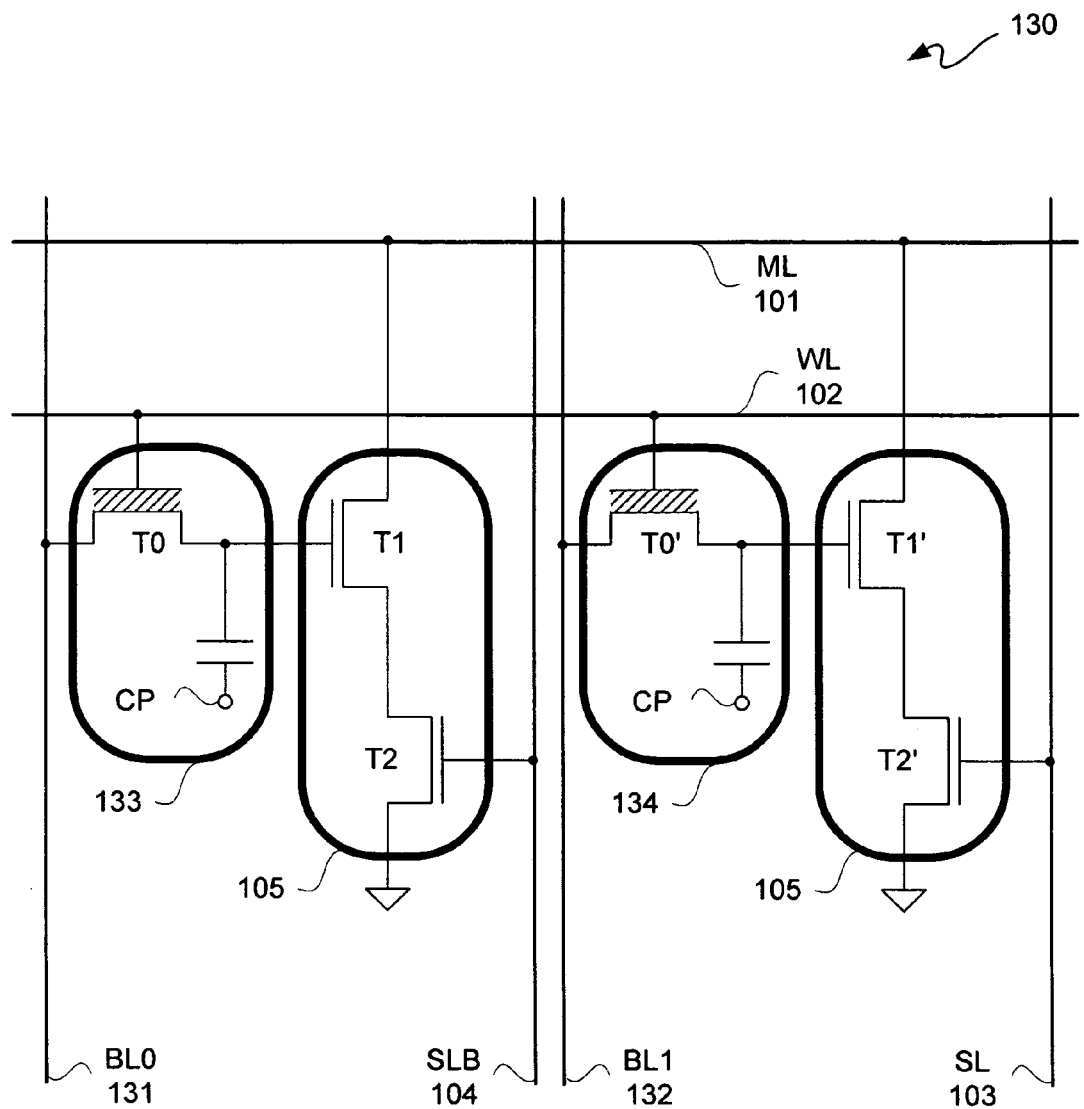
FIG. 1D is a circuit diagram depicting an exemplary embodiment of a DRAM based TCAM cell of the prior art.

FIG. 1C is a circuit diagram depicting an exemplary embodiment of a NOR-type TCAM cell 120 of the prior art. TCAM cell 120 is coupled to SL 103, SLb 104, WL 102, and ML 101. TCAM cell 120 includes XOR and ML driver circuit 105 and SRAM storage elements 126. SRAM storage elements 126 each include 5 transistors, namely two 5T SRAM gated latches.

Figure 10:
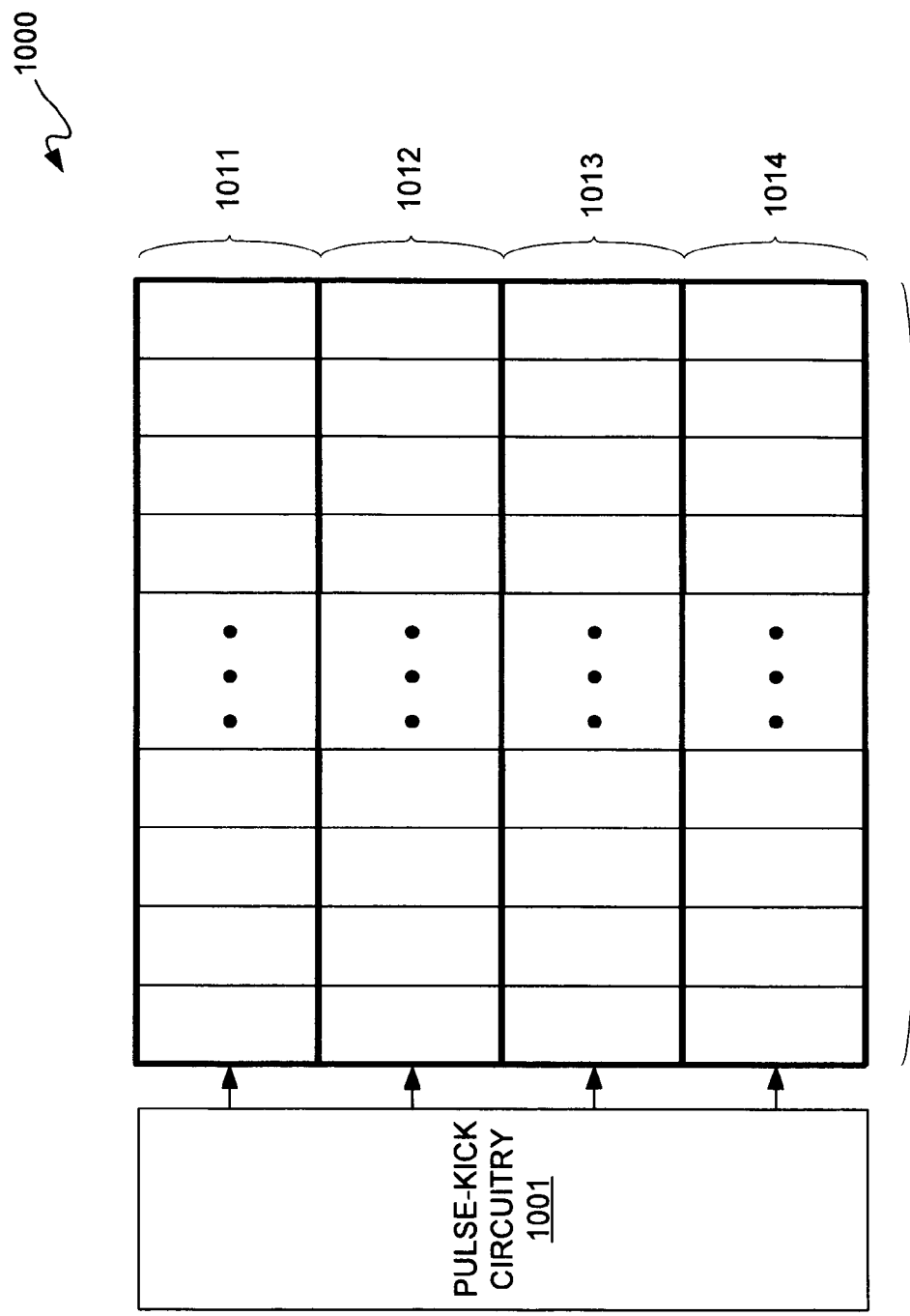
FIG. 10 is a block diagram depicting an exemplary embodiment of a thyristor-based CAM array coupled to pulse kick circuitry.

FIG. 10 is a circuit diagram depicting an exemplary embodiment of a DRAM-based TCAM cell 130 of the prior art. In addition to SL 103, SLb 104, WL 102, and ML 101, DRAM-based TCAM cell 130 includes bitline ("BL0") 131 and bitline ("BL1") 132 respectively associated with DRAM storage elements 133 and 134. Transistors T1 and T2 associated with DRAM storage element 133 and transistors T1' and T2' associated with DRAM storage element 134 collectively provide XOR and ML driver circuitry 105. Capacitors of DRAM storage elements 133 and 134 may be coupled to a cell plate ("CP"), and transistors T0 and T0' of DRAM storage elements 133 and 134 may be respectively coupled to such capacitors. Thus, there are six transistors and two capacitors for each DRAM based TCAM cell 130.

In the following description it shall be appreciated that cell area has been significantly reduced. Thus, because cell area is substantially smaller in comparison to prior CAM cells, SLs and MLs coupled to such cells are significantly shorter than in prior CAM cell arrays. Shorter SLs and MLs means less line capacitance on such SLs and MLs, and thus there is power savings by having shorter SLs and MLs. Furthermore, thyristor cell operation involves smaller voltage swings on MLs and SLs, and hence less power may be consumed compared to one or more prior CAM cells.

In the following, a TCAM architecture using two "dynamic," thinly capacitively coupled thyristor ("TCCT") storage elements per bit is described. Such TCCT storage element is refreshed along the lines of a one-transistor, one-capacitor ("1T1C") DRAM storage element, and thus may be contrasted with static TCCT storage elements employing an access transistor. Dynamic TCCT storage elements are described in additional detail in the incorporated-by-reference co-pending applications: "Thyristor Based Memory Cell and Architecture" assigned application Ser. No. 11/159,447, filed Jun. 22, 2005; "Thyristor Based Memory Cell" assigned application Ser. No. 11/881,049, filed Jul. 25, 2007; and "Thyristor Based Memory Cell" assigned application Ser. No. 11/881,159, filed Jul. 25, 2007, all of which name Farid Nemati as an inventor.

Such a dynamic TCCT CAM may be used either as a BiCAM or as a TCAM, as the same storage element may be used in either CAM architecture. However, as a dynamic TCCT TCAM allows for an additional don't care state in comparison with a dynamic TCCT BiCAM, ternary operation is described herein below. Furthermore, as shall be appreciated from the following description, a dynamic TCCT TCAM is provided with masking capability without having to have a separate masking circuit. However, it should be understood that the scope of this disclosure includes both dynamic TCCT TCAM and BiCAM architectures. It should also be appreciated that as used herein, the terms "CAM," "BiCAM," and "TCAM" may include any such CAM, whether a stand-alone integrated circuit chip or a CAM cell array embedded in a host integrated circuit chip.

In a dynamic TCCT TCAM, two TCCT storage elements per bit or cell are used to provide differential data, namely "miss and hit" comparisons for logic 1 and logic 0 search data states. Implementing a TCAM using TCCT storage elements reduces area. Another part of the area saving is due to a TCCT storage element being able to act as both differential storage elements and as an XOR pull down circuit in a NOR configuration. However, because a TCCT storage element is single-ended, namely it does not provide differential outputs like an SRAM storage element, a TCAM is implemented using two TCCT storage elements per cell or for each bit. The two TCCT storage elements are used to perform mismatch comparison for both logic 1 and logic 0 states.

The following description is in terms of a NOR-type TCAM implemented using two TCCT storage elements per bit or per CAM cell. Again, the following description is for both BiCAM and TCAM architectures using two TCCT storage elements per CAM cell, which may result in an area savings over conventional SRAM- and DRAM-based CAMs. Moreover, two TCCT storage elements per CAM cell avoids having access field effect transistors in contrast to static thyristor-based CAM, and two TCCT storage elements per CAM cell uses fewer array lines than such static thyristor-based CAM for additional area savings and reduced complexity. Because CAM cell size is reduced along with fewer lines, a dynamic thyristor-based CAM as described herein may consume less dynamic peak power compared to one or more prior CAMs.

Figure 2:
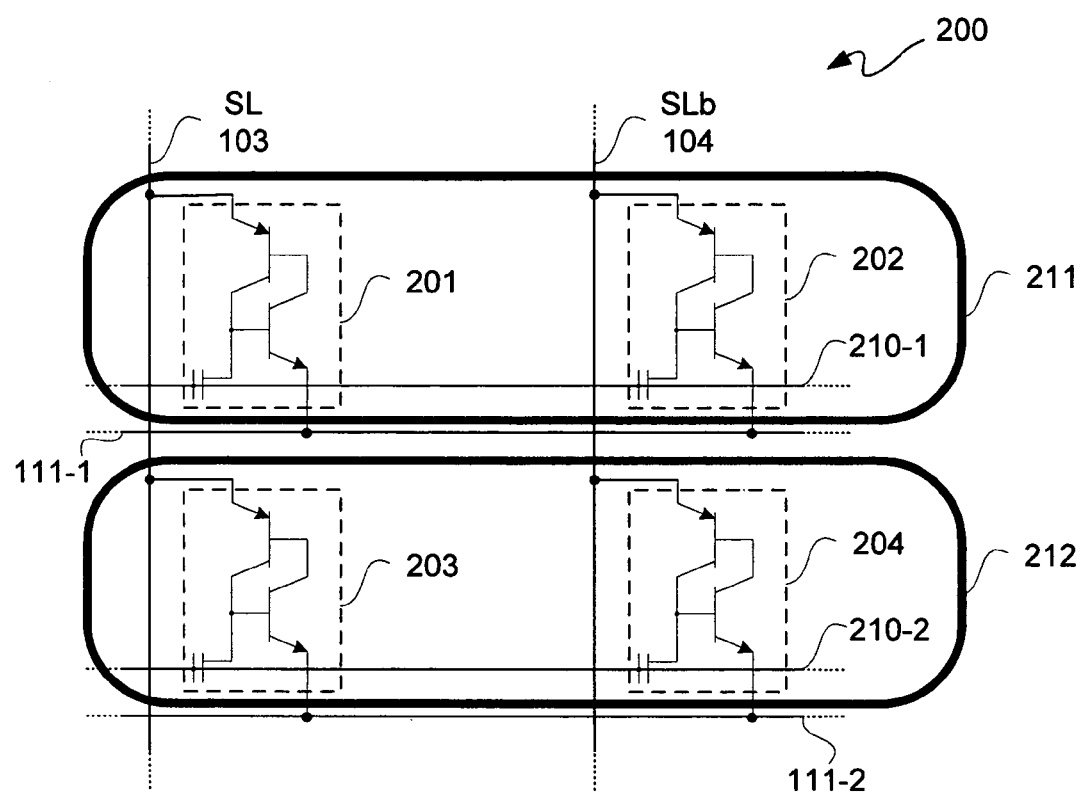
FIG. 2 is a circuit diagram depicting an exemplary embodiment of a dynamic thyristor-based CAM array of cells.

FIG. 2 is a circuit diagram depicting an exemplary embodiment of a dynamic thyristor-based CAM array of cells ("array") 200. Array 200 includes TCCT storage elements 201 through 204. Pairs of TCCT storage elements form dynamic thyristor-based CAM cells as described below in additional detail.

Even though storage elements 201 through 202 may be coupled to lines of array 200 by vias or other non-gating devices, it shall be assumed that such storage elements are "directly coupled" to such lines. Thus, a node of a storage element directly coupled to a line is not dependent upon a gating device, including a field effect transistor ("FET"), being in an ON state for electrically coupling or otherwise providing a generally conductive path between such node and such line. Furthermore, it should be understood that portions of lines of array 200 may be used in the formation of parts of TCCT storage elements 201 through 204, and such lines shall likewise be considered "directly coupled" to associated TCCT storage elements. Again, each TCCT storage element, such as TCCT storage element 201 through 204, includes no access transistor, such as an N-type FET ("NFET").

Array 200 includes two dynamic TCAM cells, namely cells 211 and 212. Cell 211 includes TCCT storage elements 201 and 202, and cell 212 includes TCCT storage elements 203 and 204. Anodes of cells 201 and 203 are directly coupled to SL 103, and anodes of cells 202 and 204 are directly coupled to SLb 104. Cathodes of cells 201 and 202 are directly coupled to MLb 111-1, and cathodes of cells 203 and 204 are directly coupled to MLb 111-2. Gates of cells 201 and 203 may be directly coupled to gateline ("GL") 210-1, and gates of cells 202 and 204 may be directly coupled to GL 210-2.

It should be understood that if a TCCT storage element is in an OFF state, for example to represent a logic 0 stored therein, then no current flows through such storage element. Contrastingly, if a TCCT storage element is in an ON state, for example to represent a logic 1 stored therein, then current may flow through such storage element, depending on potential difference between anode and cathode of such storage element. Additionally, it should be appreciated that current only flows in one direction, namely from anode to cathode.

To write a data value of a logic 0 for example to cell 211, the TCCT storage element of the pair directly coupled to the "true" or "non-complement" searchline, namely storage element 201 directly coupled to SL 103 in this embodiment, is written to a generally conducting state, namely an "ON" state for purposes of clarity, and the TCCT storage element directly coupled to the "complement" searchline, namely storage element 202 directly coupled to SLb 104 in this embodiment, is written to a generally non-conducting state, namely an "OFF" state for purposes of clarity. Thus, for purposes of clarity by way of example and not limitation, it shall be assumed that cell 211 is written to represent a data value of a logic 0.

To write a logic high value to cell 212 for example, the TCCT storage element directly coupled to the true searchline, namely storage element 203 directly coupled to SL 103, is written to an OFF state and the TCCT directly coupled to the complement searchline, namely storage element 204 directly coupled to SLb 104, is written to an ON state. Thus, for purposes of clarity by way of example and not limitation, it shall be assumed that cell 212 has stored therein a logic 1 and cell 211 has stored therein a logic 0.

Again, because TCCT cells are single-ended, two such cells are used to provide a differential pair. However, it should be appreciated that no additional transistors, namely no transistors, such as FETs, for providing an XOR function or an ML driver function need be included as part of TCCT-based cells of array 200. Furthermore, storage elements 201 through 204 need not include an access FET within CAM cells associated therewith.

Prior to writing values to a CAM to be stored for later comparison with search data, such CAM SLs and MLs may have alternate functions. For example, SLs 103 and 104 may be bitlines ("BLs") and MLs 111-1 and 111-2 for example may be wordlines ("WLs"). GLs, such as GLs 210-1 and 210-2, may be used to write to and read from TCCT storage elements. However once a CAM is configured, namely has data written to it for purposes of subsequent comparison with search data, such BLs and WLs may be used as MLs and SLs. Furthermore, it should be appreciated that a BL may be used as either an SL or an ML, and a WL may be used as an ML or an SL depending on how the BL associated therewith is used, as described below in additional detail.

Figure 3:
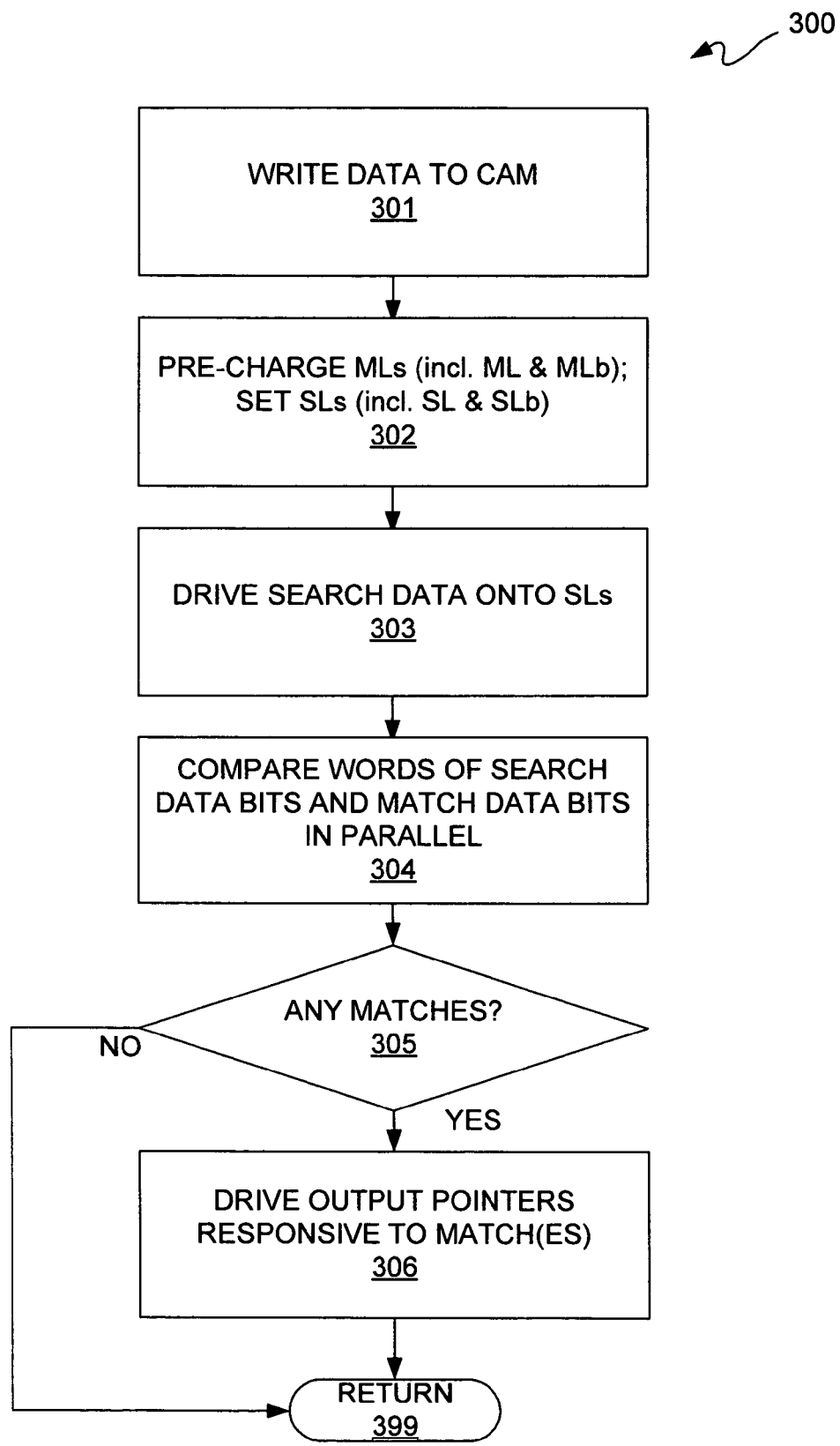
FIG. 3 is a flow diagram depicting an exemplary embodiment of a CAM operation flow.

FIG. 3 is a flow diagram depicting an exemplary embodiment of a CAM operation flow 300. At 301, match data is written to a dynamic TCCT-based CAM. This data written, which is match words, is written to multiple rows or multiple columns in the CAM for purposes of subsequent comparison against received search data. In other words this is stored match data or stored match words.

As described below in additional detail, a CAM may be searched by comparing match data rows as opposed to comparing match data columns, or alternatively a column orientation instead of row orientation may be used for search comparisons. Furthermore, it shall be understood that multiple rows or columns are compared at a time in accordance with CAM operation and that stored match data in a CAM have associated therewith addresses of such CAM. Such addresses may be used as pointers or vectors for output when matches are detected.

With simultaneous reference to FIGS. 2 and 3, flow 300 is further described. At 302, matchlines, such as MLb 111-1 and 111-2, are pre-charged and searchlines, such as SL 103 and SLb 104, are set. In this example, matchlines are precharged to a logic low level, such as coupled to ground. Furthermore, in this example, searchlines are set to a logic low level, which may be different from a logic low level for matchlines. for example 1 volt. Generally, during search operations, the "Low" and "High" logic levels for the lines connected to anodes of TCCT storage elements may be higher than the "0" and "1" logic levels, respectively, for the lines connected to the cathodes of the TCCT storage elements.

At 303, search data is driven onto searchlines. Thus, search data is driven onto multiple searchlines (which are illustratively shown with a column orientation in FIG. 2) at 303. At 304, all data bits of each stored match word are compared in parallel respectively with all data bits of a search word. If all bits of a search word match all bits of a match word as determined at 305, then the address of the stored match word matching the search word is driven as output at 306. For a one-hot configuration there is one match for a comparison cycle; however, for other configurations there may be more than one match word matched in a comparison cycle. After 306, flow 300 may return at 399 for obtaining another search word for example. For those match words not matching all bits of such a search word as determined at 304, then nothing is done at 305 with respect to those stored match words and flow 300 may return at 399.

For purposes of clarity, it shall be assumed that search data values follow the true searchline. In this example, potential of SL 103 corresponds to the search data value. Furthermore, for purposes of clarity, it shall be assumed that the TCCT storage element associated with the complement searchline follows the data state of its associated cell. Thus, if the data bit stored in a cell is a logic 0, the TCCT storage element directly coupled to the complement searchline is OFF, and if the data bit stored in a cell is a logic 1, then the TCCT storage element directly coupled to the complement searchline is ON.

For example, if search data is a logic 0 and cell data is a logic 0 for cell 211, then search data on SLb 104 is logic high and search data on SL 103 is logic low. Accordingly, storage element 202 is OFF, and thus it has no effect on voltage on MLb 111-1. Furthermore, storage element is 201 is ON, but because SL 103 is logic low, the conductive state of storage element 201 has no significant effect on MLb 111-1. Because MLb 111-1 is basically unchanged, namely there is no significant voltage rise thereon, this indicates a match or a "hit." In other words, if a match word stored in association cells directly coupled to MLb 111-1 results in such matchline being generally left at a precharged level, namely in a logic low state in this example, after a comparison with search word, then this indicates a match, namely a hit for all bits. Even though the term "word" is used, it should be understood that more than or less than one word may be used for storage as match data in a CAM. Thus, the term "word" rather than the more general term data is used herein for purposes of clarity and not limitation.

If search data equals a logic 1 and cell data of cell 212 is set for a logic 1, then storage element 203 is OFF and storage element 204 is ON. Because storage element 203 is OFF, it has no effect on the voltage level of MLb 111-2. For search data being a logic 1, SLb 104 is at a logic low state and SL 103 is at a logic high state. Thus for storage element 204 being ON, even though there is conduction from SLb 104 to MLb 111-2, because both lines are at a logic low level there is no significant voltage rise on the voltage on MLb 111-2. The result of having no significant effect on precharge voltage indicates a hit as previously described.

If a search data bit is a logic 0 and a cell data bit of cell 212 is a logic 1, then storage element 203 is OFF and storage element 204 is ON. For storage element 203 being OFF, there is no effect on MLb 111-2. However, for storage element 204 being ON and SLb 104 being at a logic 1 for a search data bit equal to a logic 0 on SL 103, voltage on MLb 111-2 rises due to electrical conductivity across storage element 204 from the logic high voltage level on SLb 104 to the logic low voltage of MLb 111-2. This rise in voltage is sufficient to indicate a non-matching data value, namely a "miss," as between a search data bit and a match data bit.

Lastly, if a search data bit is a logic 1 and cell data bit is a logic 0 for cell 211, then storage element 201 is ON and storage element 202 is OFF. Moreover, SL 103 is at logic high and SLb 104 is at logic low. Because storage element 202 is OFF, data state of storage element 202 does not have an effect on MLb 111-1. However, storage element 201 conducts the logic high of SL 103 to MLb 111-1, which causes a voltage rise on MLb 111-1 indicating a miss.

Figure 4:
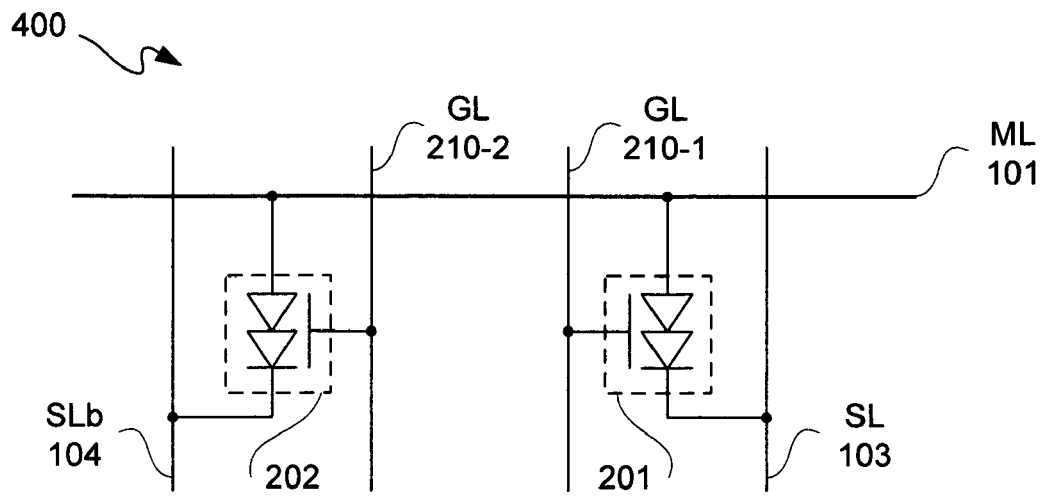
FIG. 4 is a circuit diagram depicting an exemplary embodiment of a dynamic thyristor-based TCAM cell.

FIG. 4 is a circuit diagram depicting an exemplary embodiment of a dynamic thyristor-based TCAM cell 400. Thyristor-based TCAM cell 400 includes TCCT storage elements 201 and 202. Thus, it should be understood that the abbreviated symbols for a TCCT storage element, namely a series of diodes with a control gate, is used herein for purposes of clarity rather than for example using the latch-configured bipolar transistors and coupling capacitor to a base thereof as in FIG. 2. A "don't care" or "X" state may be programmed by writing both of such TCCT storage elements 201 and 202 in cell 400 to an OFF state. Having both storage elements 201 and 202 in an OFF state means that both values on SL 103 and SLb 104 are electrically decoupled from affecting a voltage on a matchline, namely ML 101, associated therewith.

For either a dynamic thyristor-based TCAM or BiCAM implementation, TCCT storage elements may be implemented using, a bulk semiconductor substrate or a semiconductor-on-insulator/silicon-on-insulator ("SOI") substrate. Furthermore, either anodes of both TCCT storage elements of cells or cathodes of both TCCT storage elements of cells may be used to form an ML. The remaining end, whether cathodes or anodes, of such TCCT storage elements not used to form an ML may be used to form SLs.

Thus, in the example of FIG. 4, the anodes of storage elements 201 and 202 may be used for forming ML 101. Furthermore, the cathode of storage element of 201 may be used for forming SL 103, and the cathode of storage element 202 may be used for forming SLb 104. Gatelines 210-1 and 210-2 may be separate gatelines respectively for storage elements 201 and 202. Alternatively, a single common gateline may be used for storage elements 201 and 202 of cell 400 or other dynamic thyristor-based CAM cell, as described below in additional detail.

To recapitulate, there are three possible states for dynamic TCCT-based TCAM cell 400. The first state is when storage element 201 represents a logic 0 and storage element 202 represents a logic 1, namely OFF and ON, respectively. The second state is when storage element 201 represents a logic 1 and storage element 202 represents logic 0, namely ON and OFF, respectively. A third state when for both storage elements 201 and 202 represent a logic 0, namely both storage elements 201 and 202 are OFF. The last state, as previously mentioned, is a don't care state. Again, during a search against match data stored in a dynamic TCCT-based TCAM cell 400, if there is not a match with the data presented on SL 103 and SLb 104, then one of the storage elements presents a low current path between ML 101 and either of SL 103 or SLb 104. If, however, there is a match with the data presented on SL 103 and SLb 104 or if there is a don't care state, then there is a high current path between ML 101 and both of SL 103 and SLb 104.

During a read or write operation to cell 400, ML 101 may be used as a WL, and SLs 103 and 104 may be used as respective BLs, or vice versa. Again, because TCCT storage elements 201 and 202 are used, such storage elements are periodically refreshed to maintain their data state. Such refreshing involves reading out data from TCCT storage elements 201 and 202 and then writing the data back into such TCCT storage elements 201 and 202.

Figure 5:
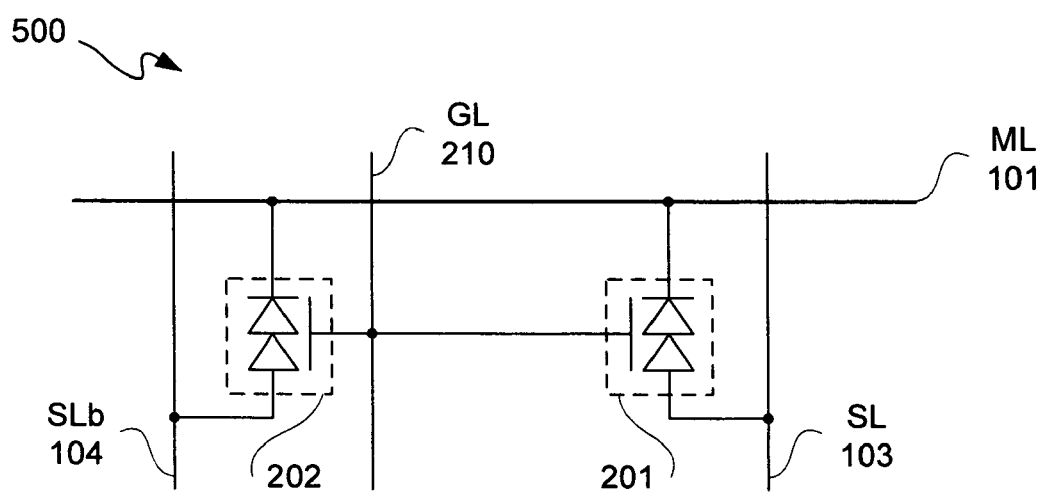
FIG. 5 is a circuit diagram depicting an exemplary alternative embodiment of a dynamic thyristor-based TCAM cell.

FIG. 5 is a circuit diagram depicting an exemplary alternative embodiment of a dynamic thyristor-based TCAM cell 500. Thyristor-based TCAM cell 500 includes TCCT storage elements 201 and 202. A "don't care" or "X" state may be programmed by writing both of such TCCT storage elements 201 and 202 in cell 500 to an OFF state. For both storage elements 201 and 202 in an OFF state, means that values on both SL 103 and SLb 104 are electrically decoupled from affecting a voltage on a matchline, namely ML 101, associated therewith.

Anodes of storage elements 201 and 202 may be used for forming SL 103 and SLb 104, respectively. Furthermore, cathodes of storage elements 201 and 202 may be used for forming ML 101. In this embodiment, a single common GL 210 is used for storage elements 201 and 202 of cell 500.

FIGS. 6A through 6H are block/circuit diagrams depicting respective exemplary embodiments of thyristor-based CAM arrays 600A through 600H, respectively. Again, TCCT storage elements 610 of thyristor-based CAM cells 699 of CAM arrays 600A through 600H may be for a TCAM or a BiCAM. FIGS. 7A through 7H are signal state diagrams depicting respective exemplary embodiments of signal states 700A through 700H, respectively. FIGS. 6A through 6H correspond to FIGS. 7A through 7H, respectively.

Figure 6A:
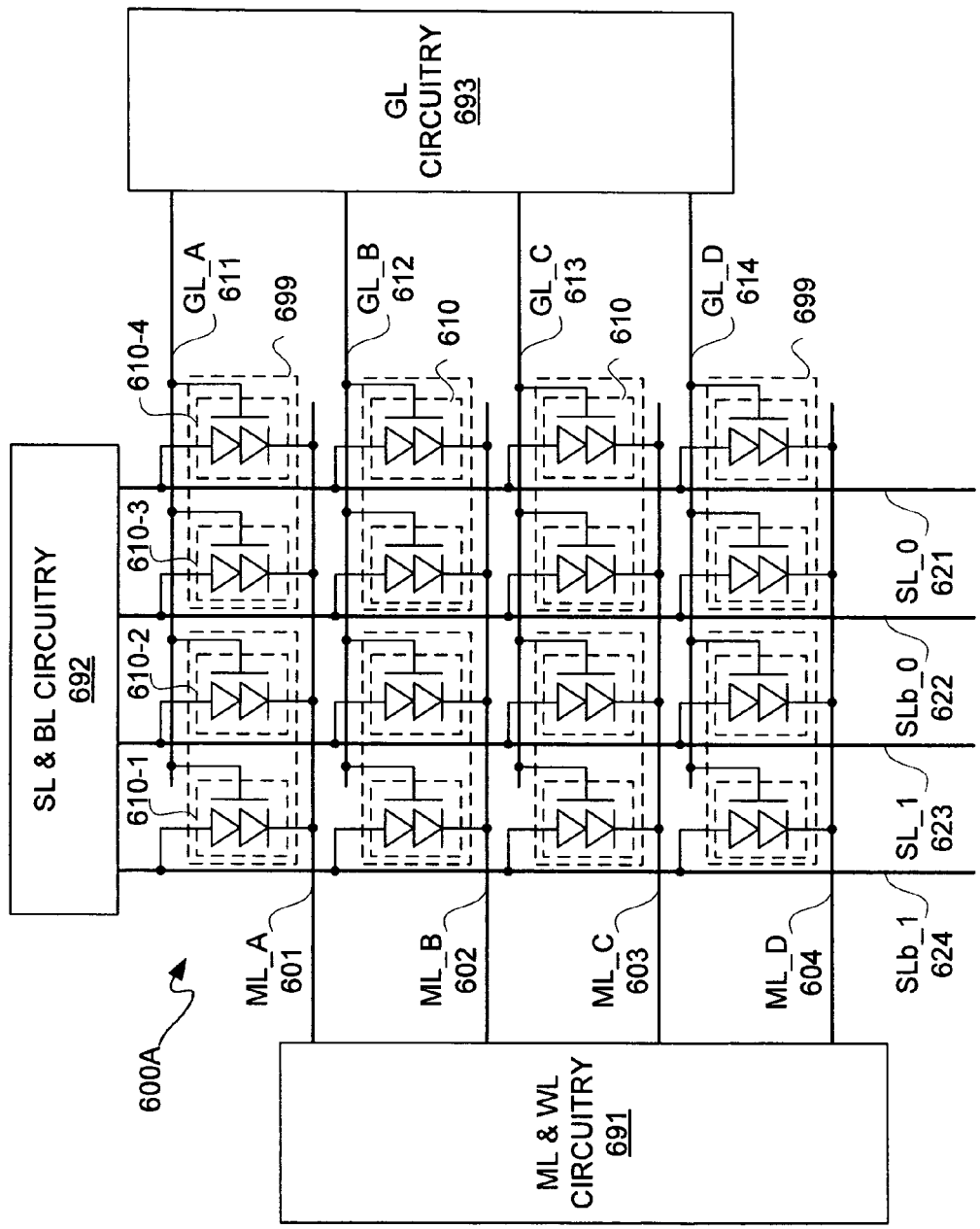
FIGS. 6A through 6H are circuit diagrams depicting respective exemplary embodiments of thyristor-based CAM arrays.
Figure 7A:
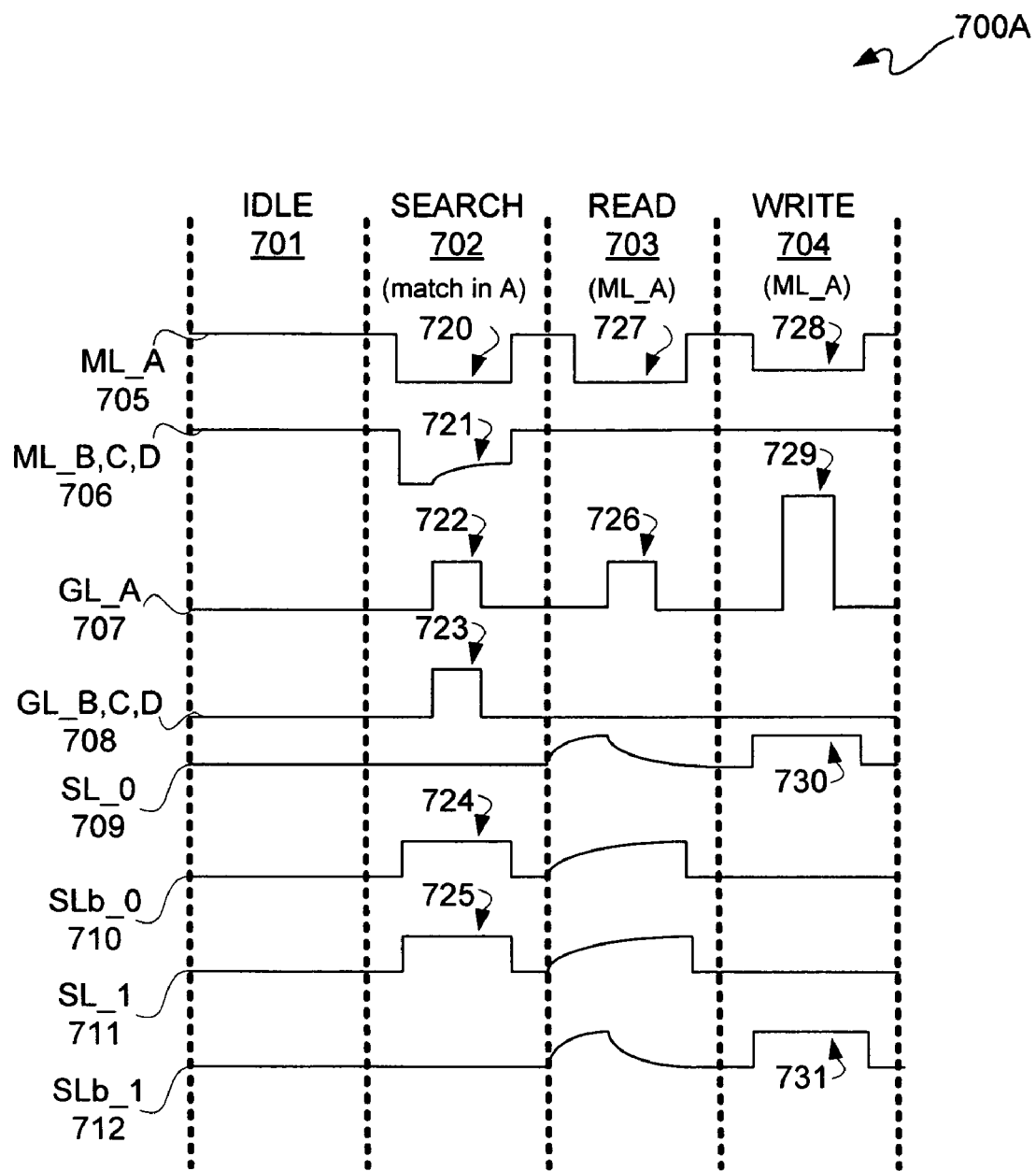
FIGS. 7A through 7H are signal state diagrams depicting respective exemplary embodiments of signal states for FIGS. 6A through 6H, respectively.

With simultaneous reference to FIGS. 6A and 7A, CAM array 600A and signal state 700A are further described. ML_A 601, ML_B 602, ML_C 603, and ML_D 604 are directly coupled to cathodes of TCCT storage elements 610 of cell array 600A.

In addition to ML_A 601 through ML_D 604, cell array 600A includes GL_A 611, GL_B 612, GL_C 613; and GL_D 614. GL_A 611 through GL_D 614 are directly coupled to control gates of TCCT storage elements 610 of cell array 600A. Cell array 600A further includes SLs and corresponding complement SLs, namely SL_0 621 and SL_1 623 and their corresponding complements SLb_0 622 and SLb_1 624, respectively. SLs 621 through 624 are coupled to anodes of TCCT storage elements 610 of cell array 600A.

In this embodiment, coupled to MLs 601 through 604 is ML and WL circuitry block 691. Coupled to SLs 621 through 624 is SL and BL circuitry block 692. Coupled to GLs 611 through 612 is GL circuitry block 693. As operation of circuitry blocks 691 through 693 will be understood by one of skill in the art from the following description, circuitry thereof is not described in unnecessary detail herein for purposes of clarity.

MLs 601 through 604 are respectively generally parallel to GLs 611 through 614. SLs 621 through 624 are generally orthogonal to MLs 601 through 604, as well as generally orthogonal to GLs 611 through 614. MLs 601 through 604 are used as WLs, or more particularly as select WLs, during write operations. SLs 621 through 624 are used as BLs during write operations. During a write operation, a GL of GLs 611 through 614 for example, is pulsed. During a search operation or a read operation, a GL, such as a GL of GLs 611 through 614, may or may not be "pulse-kicked," as described below in additional detail. Furthermore, an ML, such as of MLs 601 through 604, is used as a selected WL during a read operation, and SLs 621 and 624 for example are used as BLs during a read operation.

Signal states 700A include four states, namely idle state 701, search state 702, read state 703, and write state 704. For each of signal states 701 through 704, signaling 705 through 712 is illustratively shown in FIG. 7A.

For purposes of clarity by way of example and not limitation, it shall be assumed that a match for search state 702 is found in a row associated with ML_A 601, and that a read and a write respectively for states 703 and 704 are to such row associated with ML_A 601. Even though for this example a particular row is selected, it should be appreciated that any of the rows may be selected.

ML_A signaling 705 corresponds to signaling on MLA 601. ML_B,C,D signaling 706 represents signaling on each of MLs 602 through 604. GL_A signaling 707 corresponds to signaling on GL 611. GL_B,C,D signaling 708 represents signaling on each of GLs 612 through 614. SL_0 signaling 709, SLb_0 signaling 710, SL_1 signaling 711, and SLb_1 signaling 712 respectively correspond to signaling on SLs 621 through 624.

With reference to FIGS. 7A through 7H, 8, and 9, for purposes of clarity by way of example and not limitation, example voltage values may be provided. However, it shall be appreciated that these voltage values, may be changed or may be approximate voltage values or a combination thereof. Thus, it should be understood that these or other voltage values may be used in accordance with the scope of the description herein.

Example voltage levels for idle state 701 may be 1 volt for ML signaling 705 and 706, −0.5 volts for GL signaling 707 and 708, and 1 volt for signaling 709 through 712. For a match in search state 702, namely a match for MLA 601, signaling 705 may be less than or equal to 0.2 volts. In other words, ML_A 601 is precharged to a range of approximately 0 to 0.2 volts during a search operation, as generally indicated at 720; this potential remains generally unchanged if a match is detected in cell array 600A on ML_A 601. However, each of MLs 602 through 604 may have an increase above this voltage level which is detectable, as generally indicated at 721. Again, for purposes of clarity by way of example and not limitation, it shall be assumed that a miss in ML 602 through 604 means a voltage greater than or equal to approximately 0.4 volts as generally indicated at 721. Thus, it should be understood that for power savings, as well as increased speed, sensed voltage does not have to rise to a full rail voltage, but rather generally to only 40 percent of such full rail voltage. Thus, with voltage in a range from about 40 to 50 percent of an idle state voltage level, a miss may be sensed.

During a search operation as indicated by search state 702, GLs 611 through 614 are pulsed as indicated by pulses 722 and 723 of GL signaling 707 and 708. In this example, voltage on GL signaling 707 and 708 is brought from −0.5 volts to 0 volts for producing a pulse. Thus, it should be appreciated that the top of pulses 722 and 723 is 0 volts. SL signaling 709 through 712 has voltages responsive to search data. In this example, SL_0 signaling 709 remains at 1 volt and SLb_0 signaling 710 is raised to 1.5 volts as generally indicated by pulse 724. It should be appreciated that SLs may be precharged to a logic low level of 1 volt and a logic high applied to an SL will cause such SL to be raised in voltage from the precharged level of 1 volt to 1.5 volts. SL signaling 709 and 710 are opposite states as previously described. Furthermore, in this example, SL_1 signaling 711 is logic high as indicated by a pulse 725 and SLb_1 complement signaling 712 is logic low.

It should be appreciated that if GLs such as GLs 611 through 614 are pulsed during a search operation, such as indicated by pulses 722 and 723, then effectively TCCT storage elements 610 associated with such GLs are conditioned to activate ("turn on") within a sufficient amount of time. Furthermore, in this embodiment, if an ML is read, such as ML_A 601, then an associated GL, such as GL_A 611, is pulsed as indicated by pulse 726. Additionally, in this embodiment, if an ML is written, such as ML_A 601, then an associated GL, such as GL_A 611, is pulsed as indicated by pulse 729.

For a read operation for read state 703, unselected MLs, such as MLs 602 through 604 in this example are at 1 volt, and a selected ML, such as ML_A 601 in this example, is brought down to 0 volts as indicated by step 727.

Unselected GLs as indicated by GL signaling 708 in this example are at −0.5 volts, and a selected GL as indicated by GL signaling 707 is brought up to 0 volts as indicated by pulse 726. SLs 709 through 712 are used as BLs, and are less than or equal to 1.2 volts for logic high values or are greater than or equal to 1.4 volts for logic low values.

For write state 704 for writing to ML_A 601, ML_A 601 is brought to 0.5 volts as indicated by step 728. For a write operation, unselected MLs, such as MLs 602 through 604 in this example, are at 1 volt as indicated by ML signaling 706. A selected GL 611 is pulsed as indicated by pulse 729 to a 1.5 volt level as indicated by GL signaling 707. Unselected GLs, such as GLs 612 through 614 for this example, are at −0.5 volts as indicated by GL signaling 708: SL signaling 709 through 712 is at either 1.5 volts for logic high or 1 volt for logic low. In this example, pulse 730 indicates that SL_0 signaling 709 has a logic 0 being written to at least one TCCT cell associated therewith, and likewise as indicated by pulse 731 for SLb signaling 712.

Figure 6B:
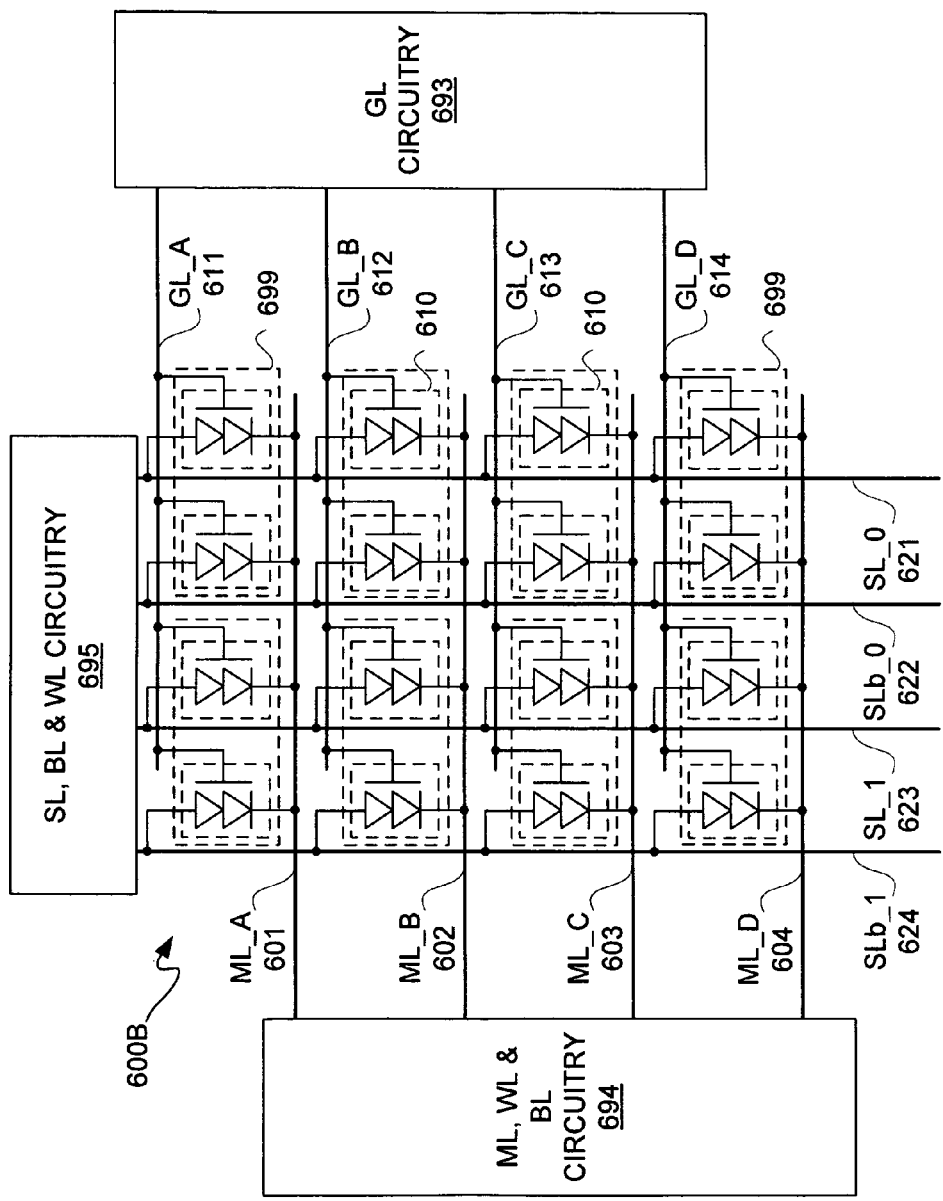
Figure 7B:
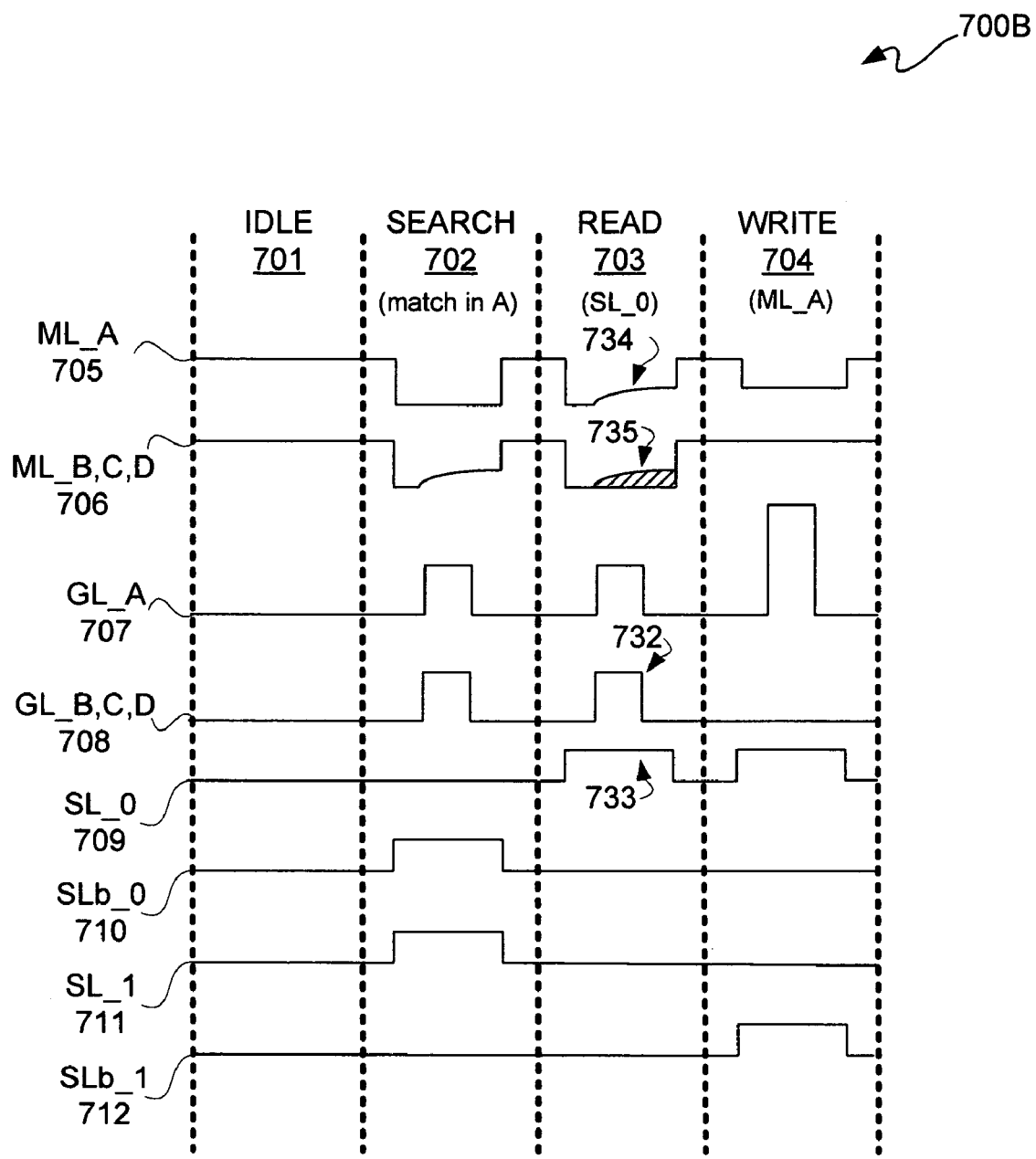

With simultaneous reference to FIGS. 6B and 7B, cell array 600B and signal states 700B are described. In array 600B, MLs 601 through 604 are generally parallel to GLs 611 through 614, and MLs 601 through 604 are used as BLs during read operations. An SL of SLs 621 through 624 is used as a selected WL during a read operation. During a write operation, a selected ML, such as of MLs 601 through 604, is used as a selected WL, and SLs 621 through 624 are used as BLs.

In this embodiment, coupled to MLs 601 through 604 is ML, WL and BL circuitry block 694. Coupled to SLs 621 through 624 is SL, BL and WL circuitry block 695. Coupled to GLs 611 through 612 is GL circuitry block 693. As operation of circuitry blocks 693 through 695 will be apparent to one of skill in the art from the following description, circuitry thereof is not described in unnecessary detail herein for purposes of clarity. It should, however, be understood that different voltage levels and BL/WL functionality modes as described herein may mean different configurations of circuitry blocks even though same or similar circuitry may be used, such as among circuitry blocks 691, 692, 694, 695, as well as circuitry blocks 696 through 699 of FIGS. 6E through 6A. Furthermore, for purposes of clarity GL circuitry block 693 is used for FIGS. 6A through 6H, even though there may be variations of such circuitry block among the variety of embodiments described with reference to FIGS. 6A through 6H.

In this exemplary embodiment, it shall again be assumed that the match is found in A and the write is to A, namely ML_A 601. However, for the read operation, it shall be assumed that SL_0 621 is the selected WL. The same example voltage levels used for idle state 701 and search state 702 with reference to FIG. 7A are used for the exemplary embodiment of FIG. 7B. Furthermore, the operation for idle state 701 and search state 702 is as previously described with reference to FIG. 7A, and thus such description is not repeated.

During write state 704, a GL, namely GL_A 707, is pulsed, as indicated at pulse 729 of FIG. 7A, as previously described. Furthermore, a GL may or may not be pulse-kicked during a read or write operation. In contrast to FIG. 7A, in FIG. 7B it should be appreciated that GLs 612 through 614 in addition to GL 611 are pulsed during a read operation, as generally indicated by pulse 732. Otherwise, operation during write state 704 is as previously described with reference to FIG. 7A, and thus is not repeated.

For read state 703, unselected SLs are at 1 volt and selected SLs are at 1.5 volts. Again, SLs are used as WLs during a read operation. In this example, SL_0 621 is selected for a read and hence SL signaling 709 is pulsed as indicated by pulse 733. All other SLs are at unselected levels, as indicated by SL signaling 710 through 712. Furthermore, for a read operation voltage on MLs, such as MLs 601 through 604 as generally indicated by voltages rises 734 and 735, voltage on such MLs may rise depending on the data stored on associated TCCT storage element 610. Again, MLs during a read operation are used as BLs in this embodiment.

Figure 6C:
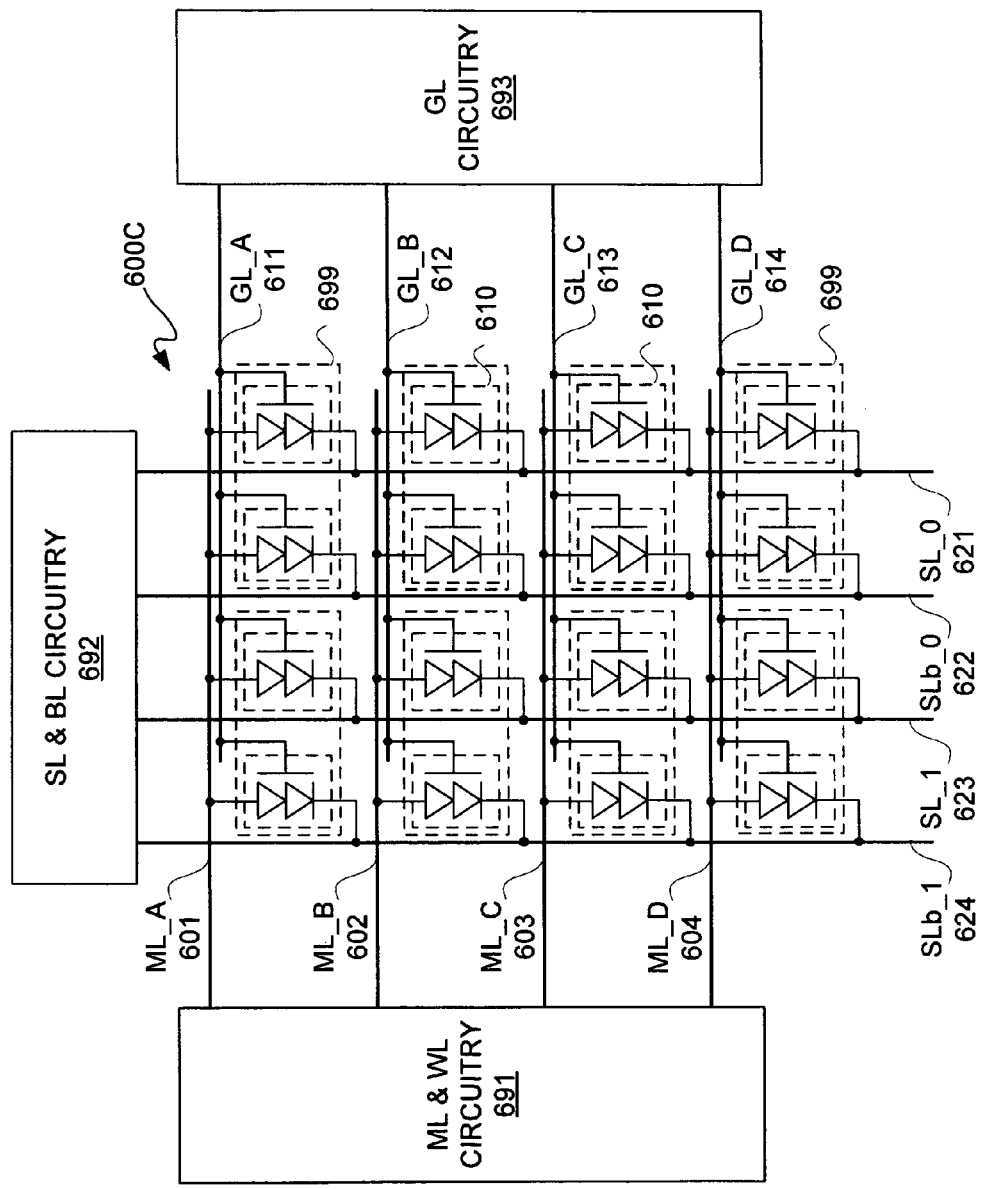
Figure 7C:
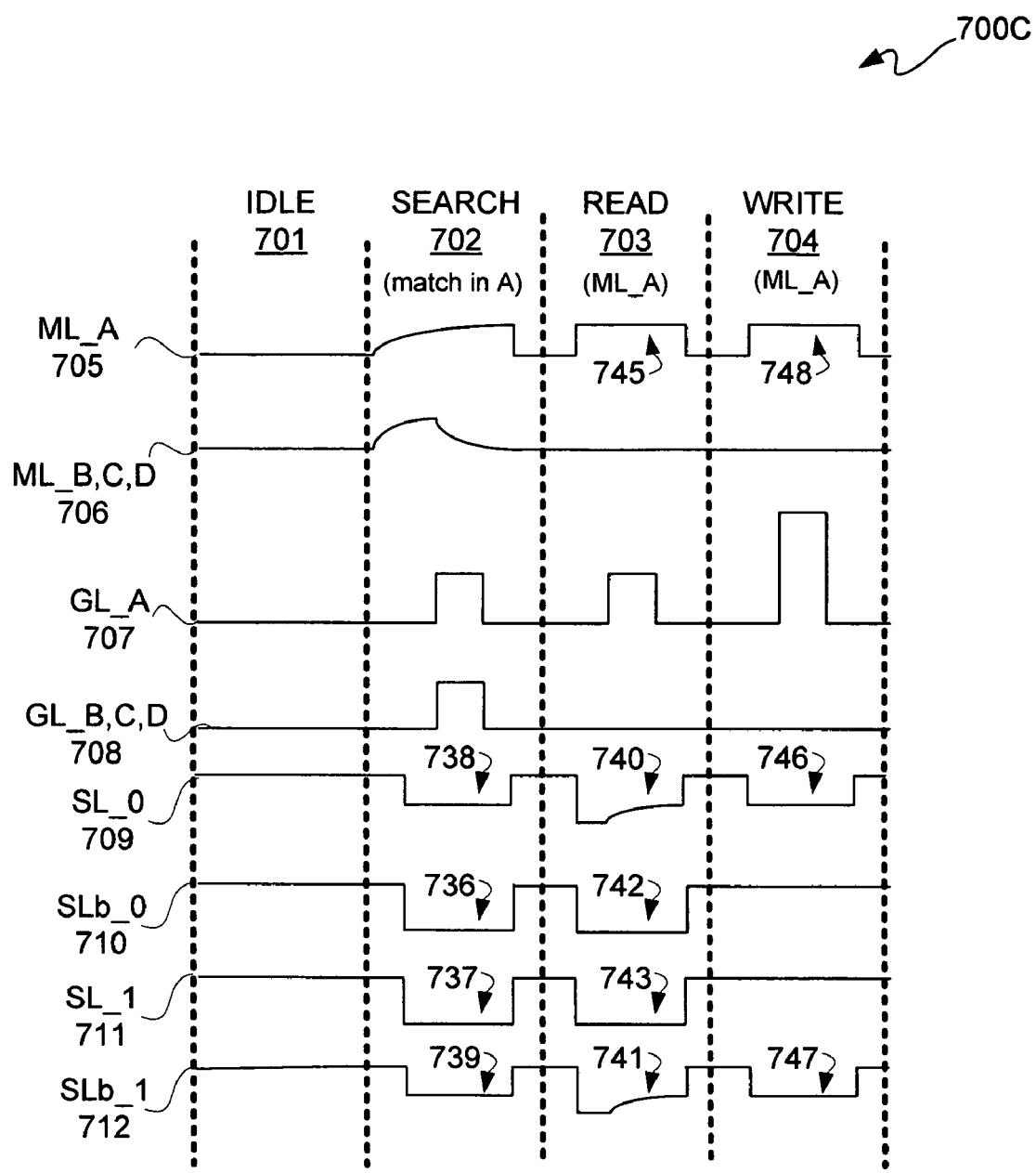

With simultaneous reference to FIGS. 6C and 7C, MLs 601 through 604 are again generally parallel to GLs 611 through 614; however, in this embodiment MLs are directly coupled to anodes of TCCT storage elements 610. Again, SLs 621 through 624 are used as BLs during read operations, and a selected ML is used as a WL during a read operation. Furthermore, as previously described with reference to FIGS. 6A and 7A, an ML is used as a selected WL during a write operation, and SLs are used as BLs during a write operation. In this embodiment, coupled to MLs 601 through 604 is ML and WL circuitry block 691, and coupled to SLs 621 through 624 is SL and BL circuitry block 692.

GLs may be or may not be pulse-kicked during search or read operations and GLs are pulsed during write operations. For this example, it shall be assumed, as it was with respect to FIG. 7A, that the match is found in A and the read associated with read state 703 and the write associated with write state 704 are of and to, respectively, ML_A 601. Idle voltage values are as previously described with reference to FIGS. 6A and 7A.

Search voltage values are the same as was described with reference to FIGS. 6A and 7A except for on SLs. In this example, for a search operation, SLs have a value of either 0 volts or 0.5 volts. Thus, for search state 702, voltages are stepped down to 0 volts as indicated by step 736 for SLb_0 signaling 710 and step 737 for SL_1 signaling 711. Furthermore, for search state 702 voltages are stepped down to 0.5 volts as indicated by steps 738 and 739, respectively, for SL_0 signaling 709 and SLb_1 signaling 712.

For a read operation, ML voltage is 1 volt for unselected MLs and 1.5 volts for selected MLs. In other words, ML_A 705 is selected for a read operation as generally indicated by pulse 745. GL voltage is as previously described with reference to FIGS. 6A and 7A for a read operation. Furthermore, for a read operation, SL voltage is less than or equal to 0.2 volts for a data logic 0 and greater than or equal to 0.4 volts for a data logic 1 with respect to SLs. Thus, for example voltage rise 740 and 741 respectively of SL signaling 709 and 712 indicate data logic 1s and steps 742 and 743 respectively of SL signaling 710 and 711 indicate data logic 0s.

For a write operation, ML voltage is 1 volt for unselected MLs and 1.5 volts for selected MLs. In other words, ML_A 705 is selected for a write operation as generally indicated by pulse 748. GL voltage is as previously described with reference to FIGS. 6A and 7A. SL voltage is 1 volt for a data logic 0 and 0.5 volts for a data logic 1. Thus, steps 746 and 747 of SL signaling 709 and 712, respectively, indicate data logic 1 values.

Figure 6D:
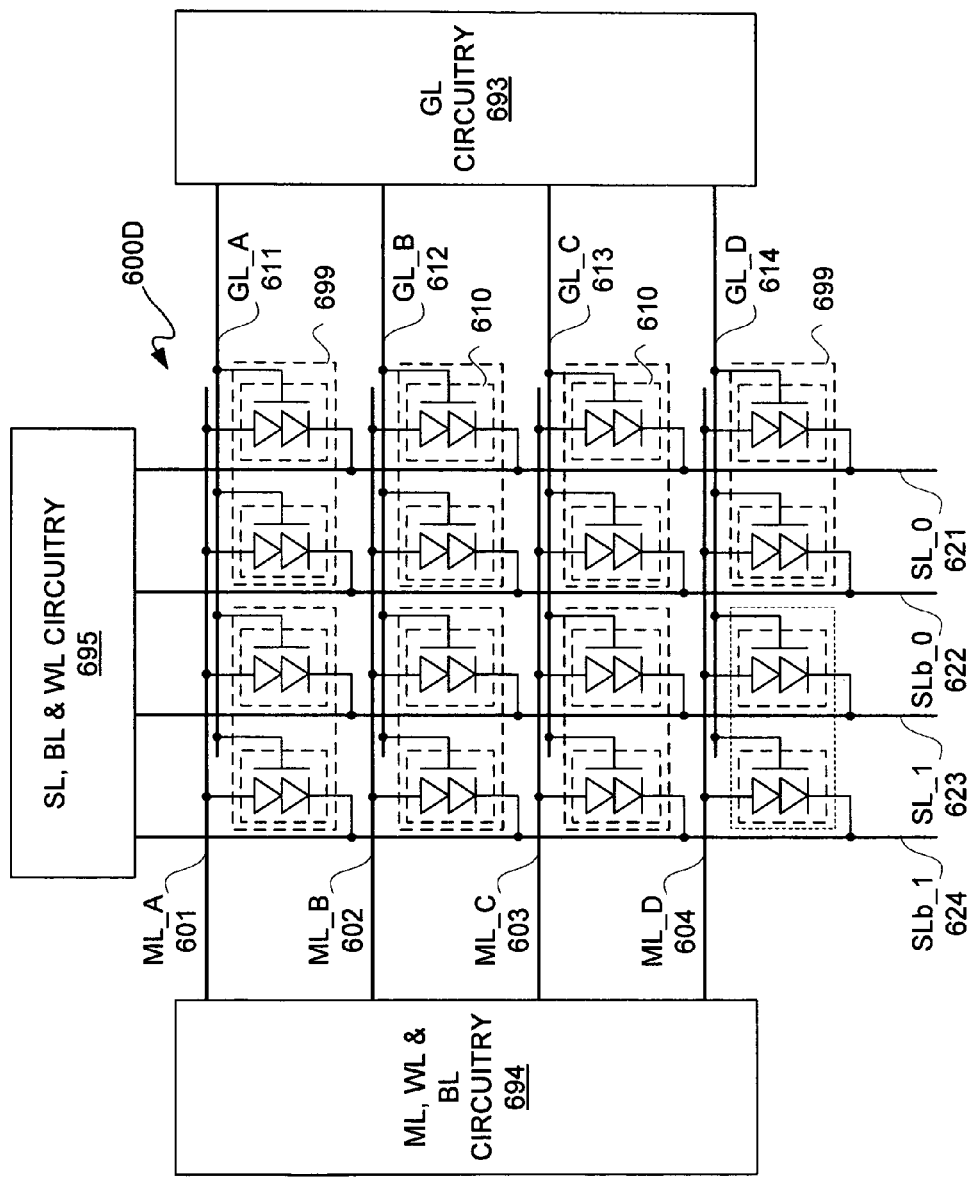
Figure 7D:
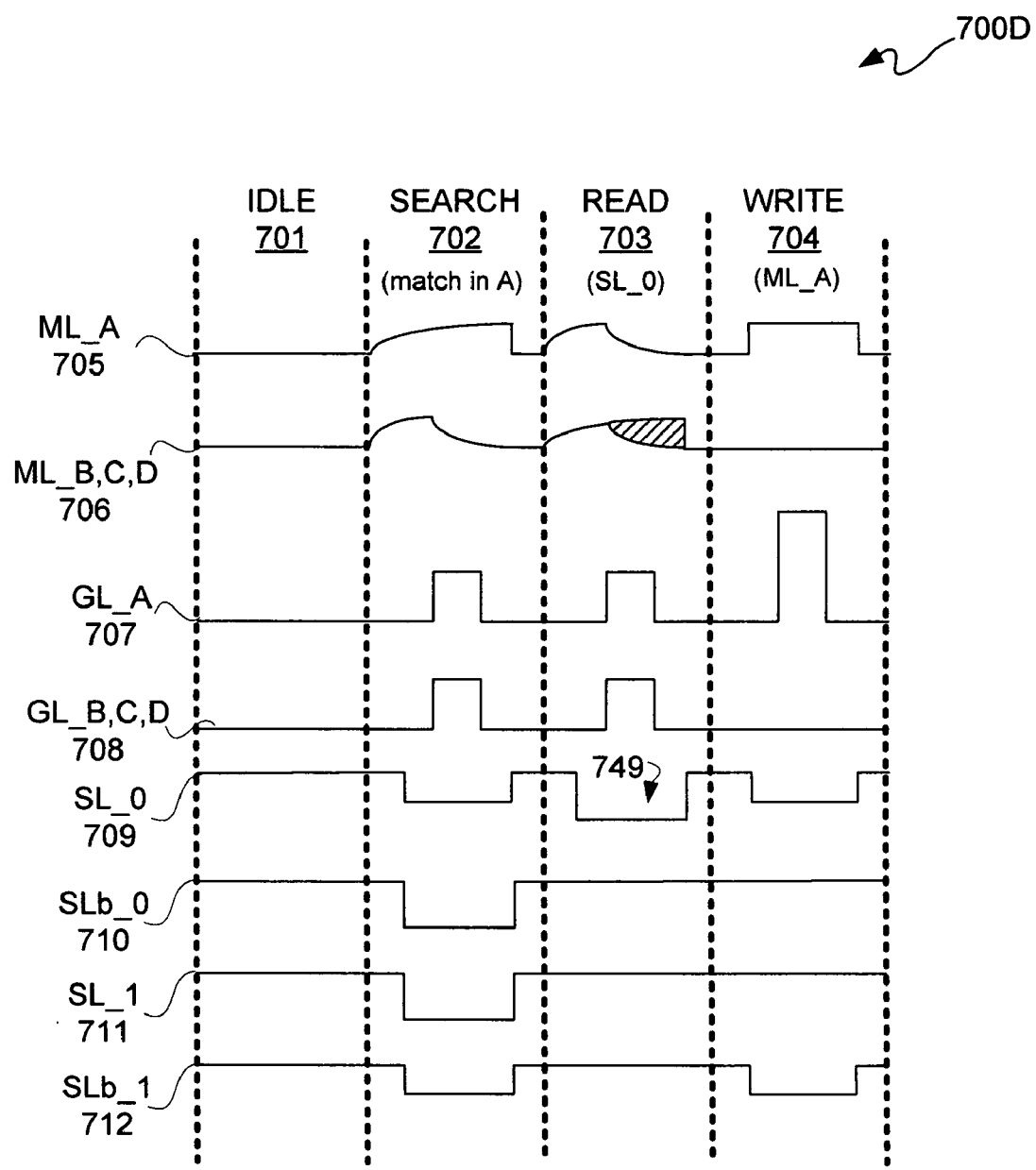

With simultaneous reference to FIGS. 6D and 7D, cell array 600D and state signaling 700D are described. In this embodiment, MLs 601 through 604 are generally parallel to GLs 611 through 614, MLs 601 through 604 are directly coupled to anodes, and SLs 621 through 624 are directly coupled to cathodes of TCCT storage elements 610 of thyristor-based CAM cells 699.

However, in this exemplary embodiment, MLs 601 through 604 are used as BLs during a read operation and an SL, such as of SLs 621 through 624, is used as a selected WL during a read operation. Furthermore, in this embodiment, an ML is used as a selected WL during a write operation, and SLs are used as BLs during a write operation as previously described with reference to FIG. 6B. In this embodiment, coupled to MLs 601 through 604 is ML, WL and BL circuitry block 694. Coupled to SLs 621 through 624 is SL, BL and WL circuitry block 695. Furthermore, as previously described with reference to FIGS. 6A and 7A, GLs are pulsed during a write operation and GLs may or may not be pulse-kicked during a read or search operation.

Voltages for idle state 701 are as previously described with reference to FIG. 7A. Voltages for search state 702 are as previously described with reference to FIG. 7C. Voltages for read state 703 for GLs are the same as described with reference to FIG. 7B for a read operation. Step 749 of SL_0 signaling 709 indicates that SL_0 621 was selected for a read operation. ML voltages for a read operation are less than or equal to 1.2 volts for a logic 1 and greater than or equal to 1.4 volts for a logic 0. Again, in this example as in the example of FIG. 7B, it is assumed that the match is found in ML_A 601, the write is to ML_A 601, and the read is from SL_0 621. For a write operation, the voltages are as previously described with reference to FIG. 7C.

Figure 6E:
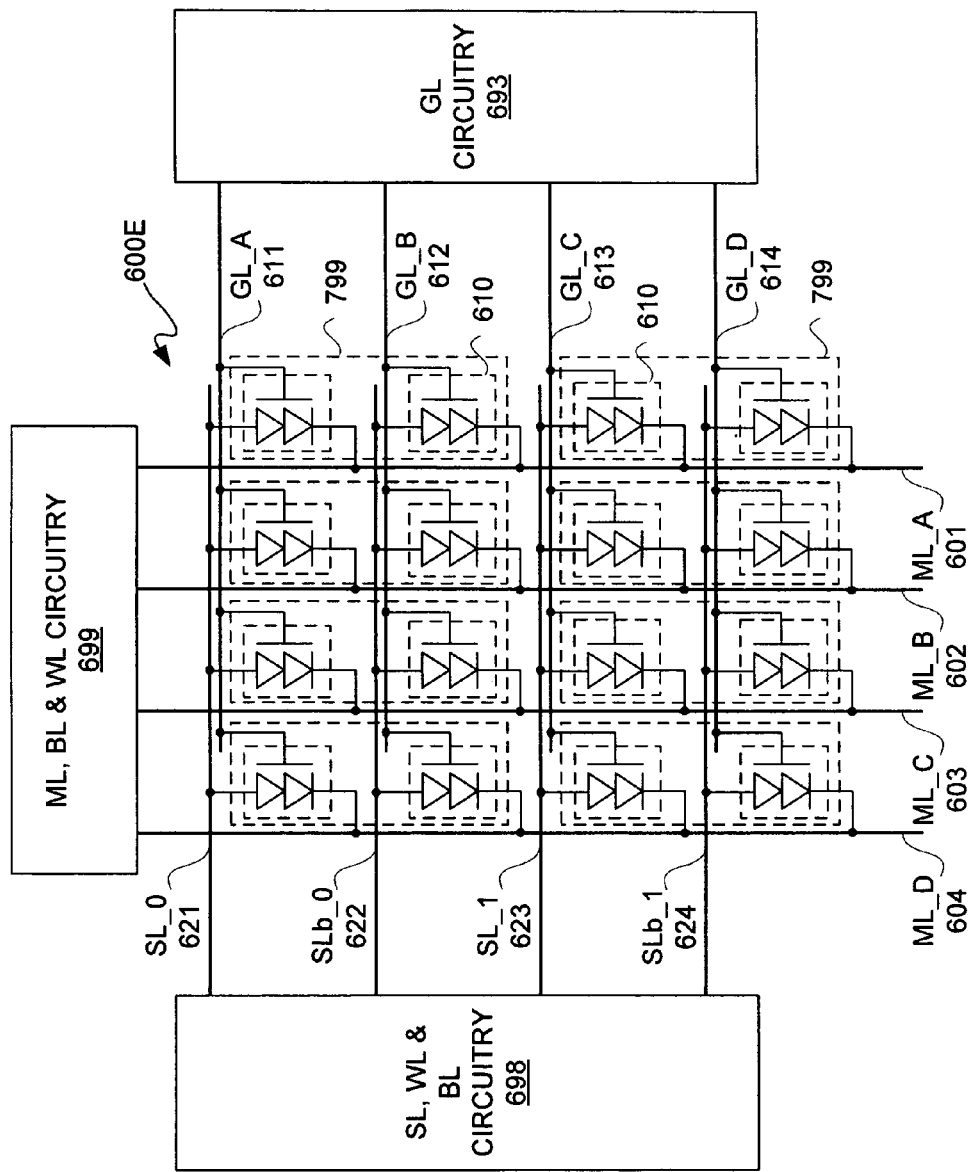
Figure 7E:
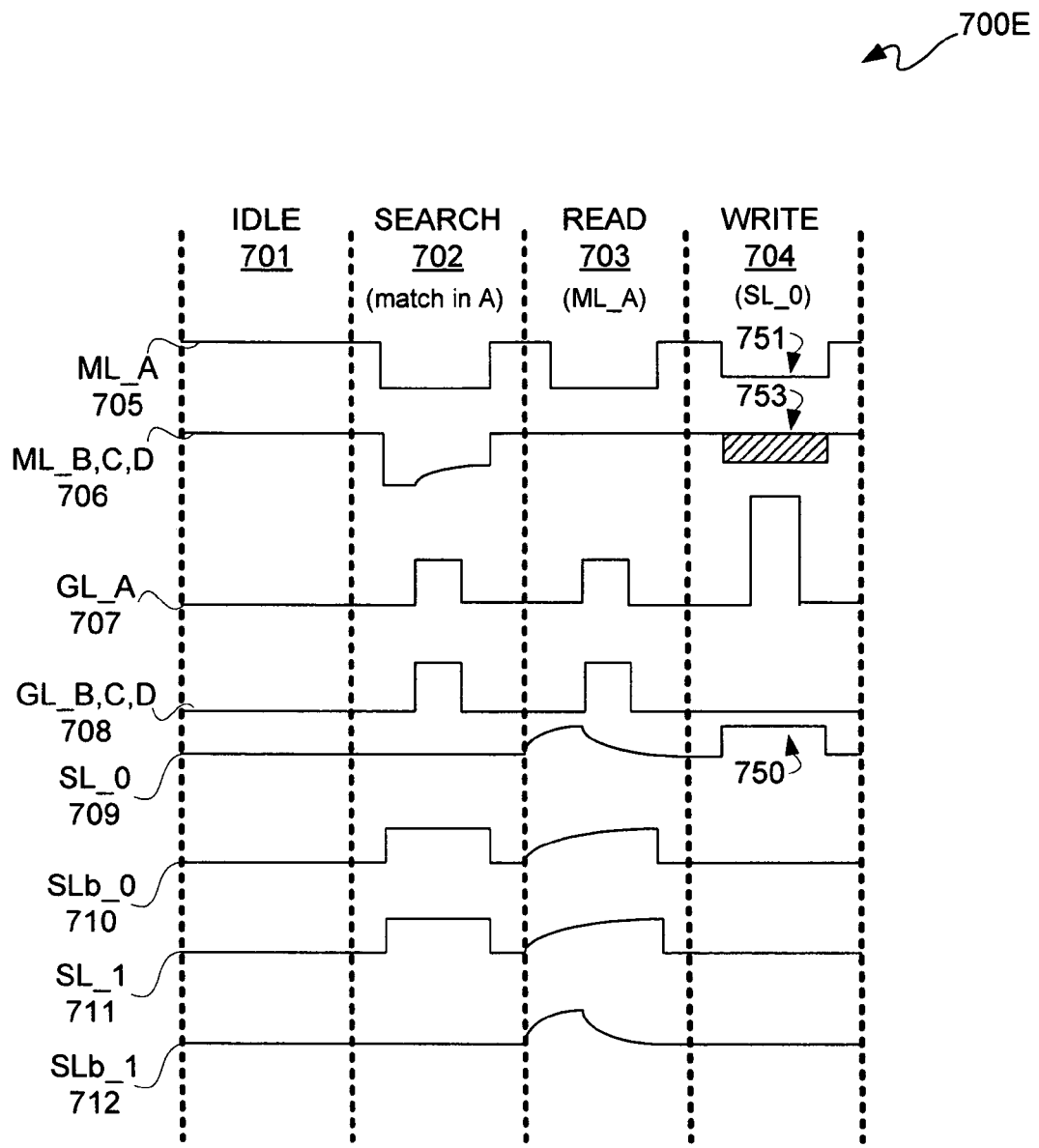

With simultaneous reference to FIGS. 6E and 7E, cell array 600E and signal state 700E are described. In this embodiment, MLs 601 through 604 and SLs 621 through 624 have been switched in position in cell array 600E with respect to for example the position of such MLs and SLs in cell array 600C of FIG. 6C. In this embodiment, MLs 601 through 604 are directly coupled to cathodes of TCCT storage elements 610 and generally orthogonal to GLs 611 through 614, as well as are generally orthogonal to SLs 621 through 624. SLs 621 through 624 are generally parallel to GLs 611 through 614, and SLs 621 through 624 are directly coupled to anodes of TCCT storage elements 610.

In this embodiment, an ML, such as of MLs 601 through 604, may be selected as a WL during a read operation, and SLs 621 through 624 are used as BLs during a read operation. Furthermore, in this embodiment a selected SL is used as a WL during a write operation and MLs are used as BLs during a write operation. GLs are pulsed during a write operation, and may or may not be pulse-kicked during search or read operations. In this embodiment, coupled to MLs 601 through 604 is ML, BL & WL circuitry block 699, and coupled to SLs 621 through 624 is SL, WL and BL circuitry block 698.

Idle voltages may be as previously described for idle state 701 as described with reference to FIG. 7A. It shall be assumed that the match is found in ML_A 601 and that the read is to ML_A 601. However, it shall be assumed that the write is to SL_0 621.

It should be noted that in FIGS. 6A through 6D, TCCT storage elements 610 were in pairs side by side with respect to one another for forming CAM cells 699. However, in FIGS. 6E through 6H, CAM cells 799 have pairs of TCCT storage elements 610, not side by side, but rather top and bottom. Thus, in FIGS. 6A through 6D, pairs of TCCT storage elements 610 of CAM cells 699 have a horizontal orientation, and in FIGS. 6E through 6H pairs of TCCT storage elements 610 of CAM cells 799 have a vertical orientation. In other words, in FIGS. 6A through 6D, anodes of TCCT storage elements 610 of a dynamic CAM cell 699 are generally longitudinally aligned with respect to one another, and cathodes of TCCT storage elements 610 of a dynamic CAM cell 699 are generally longitudinally aligned with respect to one another. However, in FIGS. 6E through 6H, anodes and cathodes of TCCT storage elements 610 of a dynamic CAM cell 799 are all generally latitudinally aligned with respect to one another.

Returning to the description of FIGS. 6E and 7E, for search operations, such as generally indicated by search state 702, voltage levels may be as previously described with reference to FIG. 7B, and thus are not repeated. For a read operation of cell array 600E, voltage levels may be those as previously described with reference to FIG. 7A, and thus are not repeated. For write operations, voltage levels for writing to cell array 600E may be those as previously described with reference to FIG. 7C except for example SLs, such as SLs 621 through 624, are functionally reversed with MLs, such as MLs 601 through 604. Thus for example, for a write operation unselected SLs may be at 1 volt and a selected SL may be at 1:5 volts. Hence, pulse 750 of SL signaling 709 indicates that SL_0 621 is selected for a write operation. Furthermore, for a write operation a voltage level of 0.5 volts on an ML indicates a logic 1 and a voltage level of 1 volt on an ML equals a logic 0. Thus, a step 751 of ML signaling 705 indicates a logic 1 in this example. The other logic 1 and the logic 0s on MLs B, C, and D, are generally indicated by region 753.

Figure 6F:
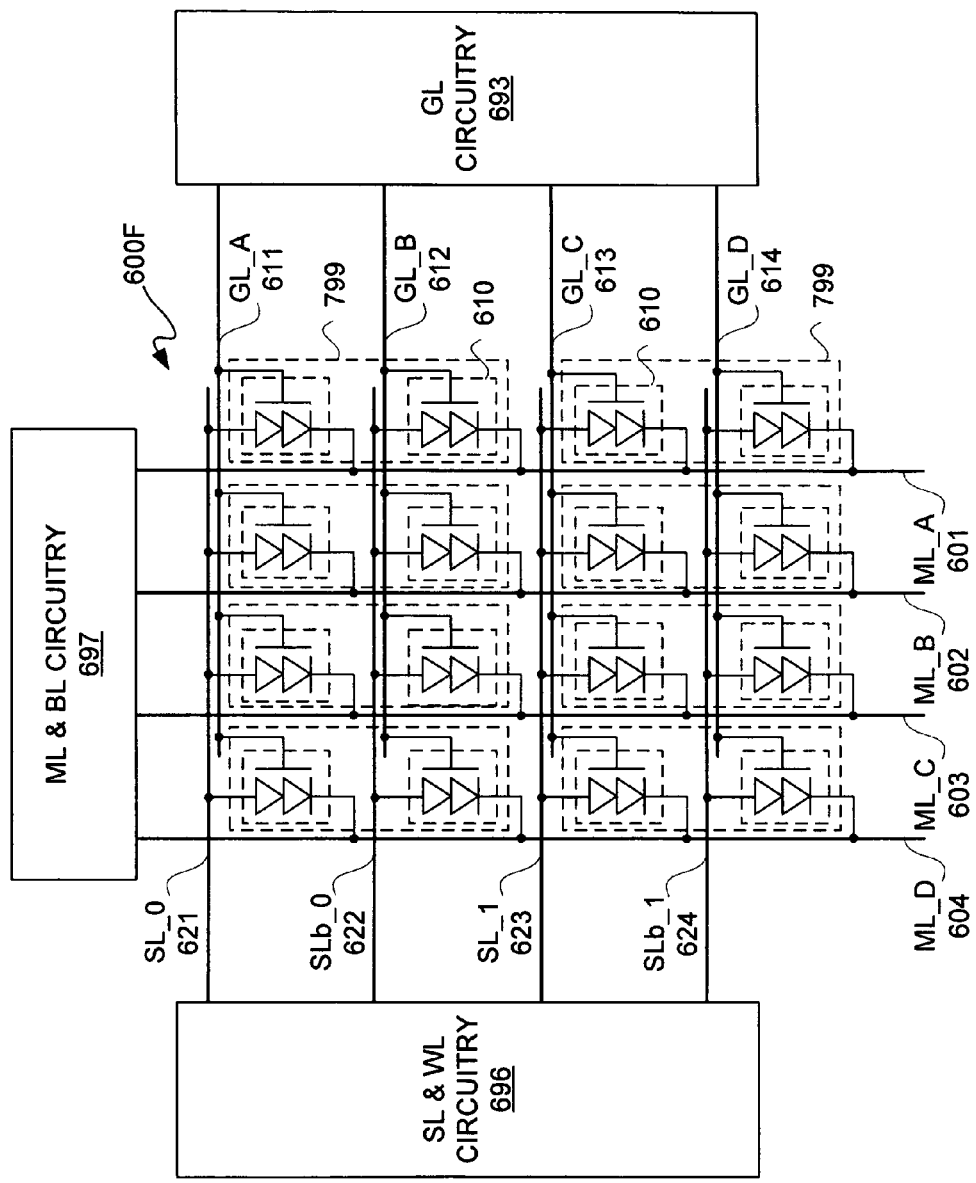
Figure 7F:
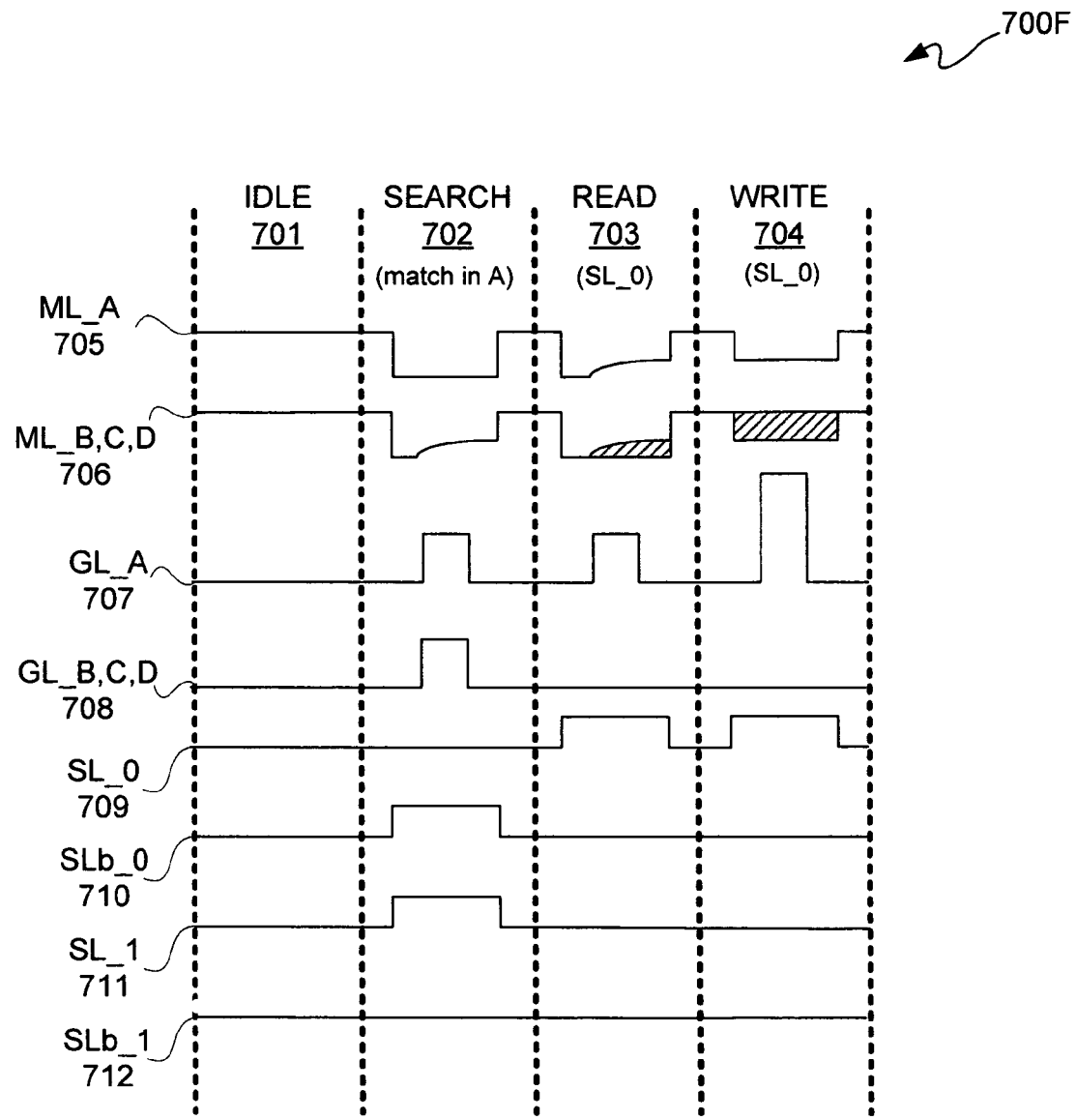

With simultaneous reference to FIGS. 6F and 7F, cell array 600F and signaling state 700F are described. In this embodiment, SLs 621 through 624, GLs 611 through 614, and MLs 601 through 604 have the same orientation as in cell array 600E of FIG. 6E except that MLs 601 through 604 are used as BLs during a read operation. Moreover, for search or read operations, GLs may or may not be pulse-kicked. In this embodiment, coupled to MLs 601 through 604 is ML & BL circuitry block 697, and coupled to SLs 621 through 624 is SL and WL circuitry block 696.

In this exemplary embodiment, it shall be assumed that the match for search state 702 is in ML_A 601 and that the read and write operations for read state 703 and write state 704, respectively, are from and to SL_0 621. The voltage levels for idle state 701 are the same as previously described with reference to FIG. 7A. The voltage levels for search state 702 are the same as described with reference to FIG. 7B. The voltage levels with respect to read state 703 are the same as described with reference FIG. 7B. The voltage levels associated with write state 704 are the same as previously described with reference to FIG. 7E. Accordingly, the description of voltage levels for states 701 through 704 are not repeated for purposes of clarity.

Figure 6G:
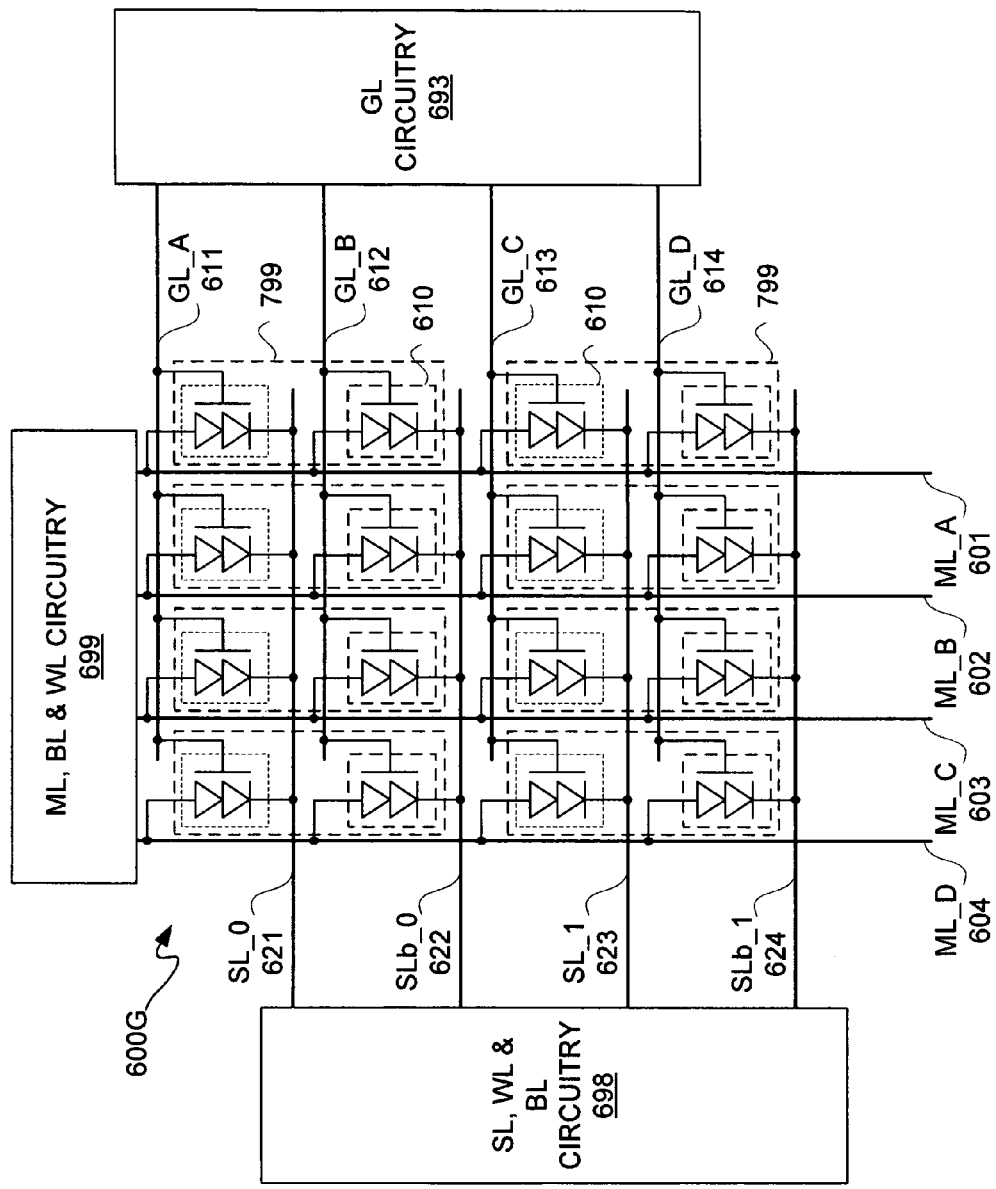
Figure 7G:
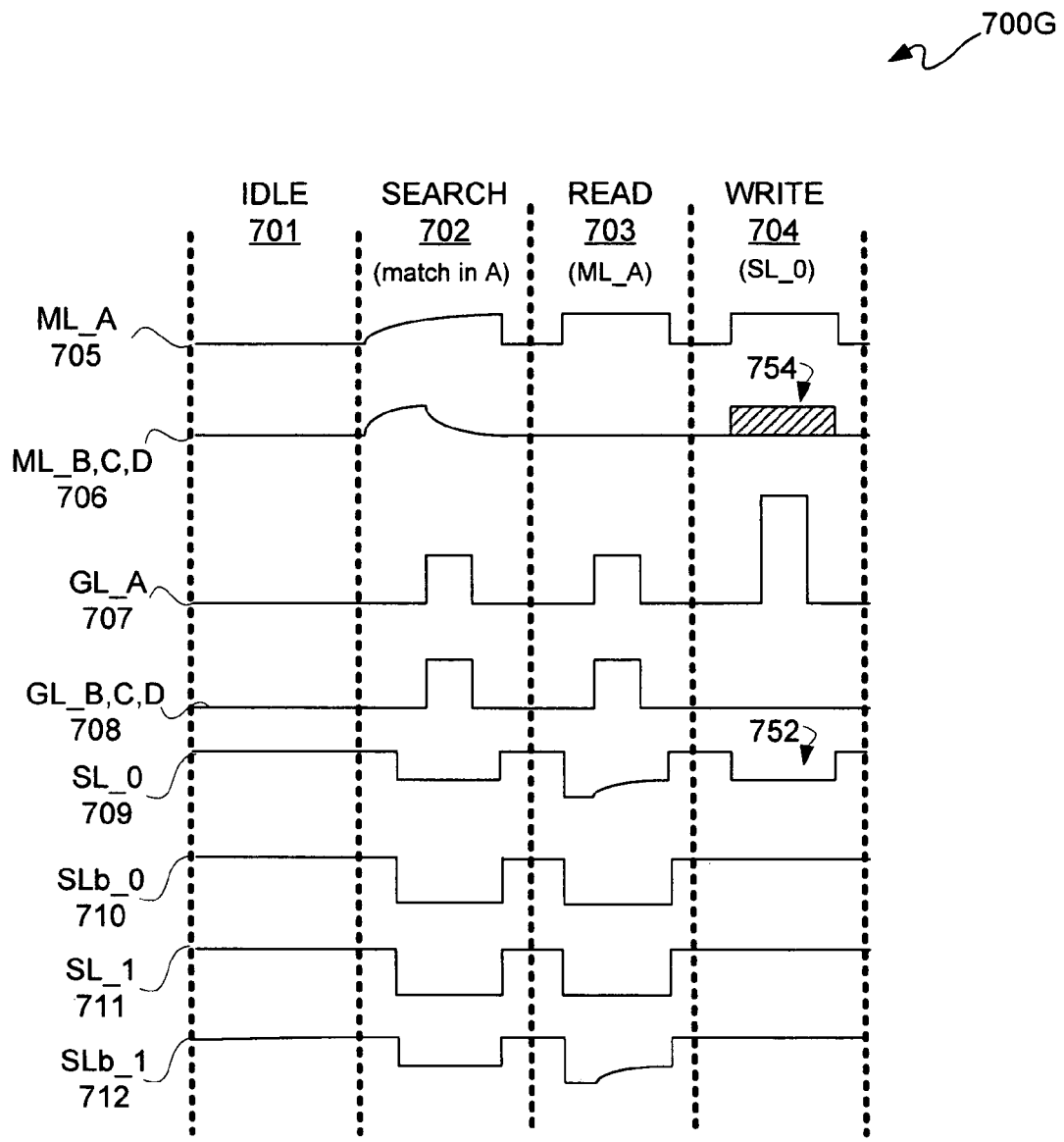

With reference to FIGS. 6G and 7G, cell array 600G and signal states 700G are described. In this embodiment; MLs 601 through 604 are directly coupled to anodes and SLs 621 through 624 are directly coupled to cathodes of TCCT storage elements 610 and SLs 621 through 624 are directly coupled to cathodes of TCCT storage elements 610. Again, MLs 601 through 604 are generally orthogonal to SLs 621 through 624 and GLs 611 through 614.

In this embodiment, SLs operate as BLs during a read operation, and a selected ML is used as a WL during a read operation. SLs, MLs, and GLs are used as previously described with reference to FIG. 6F, and again GLs may or may not be pulse-kicked during read operations. In this embodiment, coupled to MLs 601 through 604 is ML, BL & WL circuitry block 699, and coupled to SLs 621 through 624 is SL, WL and BL circuitry block 698.

The voltage levels associated with idle state 701 are as previously described with reference to FIG. 7A, and the voltage levels associated search state 702 are as previously described with reference to FIG. 7C. Again, it is assumed that the match is in ML_A 601 for search state 702.

For read state 703, it is assumed that the read is to ML_A 601 and for write state 704 it is assumed that the write is to SL_0 621. For read operation voltages, they are the same as previously described with reference to FIG. 7C. With respect to write operations, an SL of SLs 621 through 624 may be selected as a WL. For a selected SL, the voltage is 0.5 volts for a write operation as indicated by step 752 of SL signaling 709, and for unselected SLs the voltage level is 1 volt. Voltage levels for GLs during a write operation are negative 0.5 volts for unselected GLs and 1.5 volts for selected GLs, as previously described. Voltage levels for MLs during a write operation are 1 volt for logic high values and 0.6 volts for logic low values. Region 754 of ML signaling 706 indicates how storage states of TCCT storage elements 610 on MLs acting as BLs may influence BL voltages.

Figure 6H:
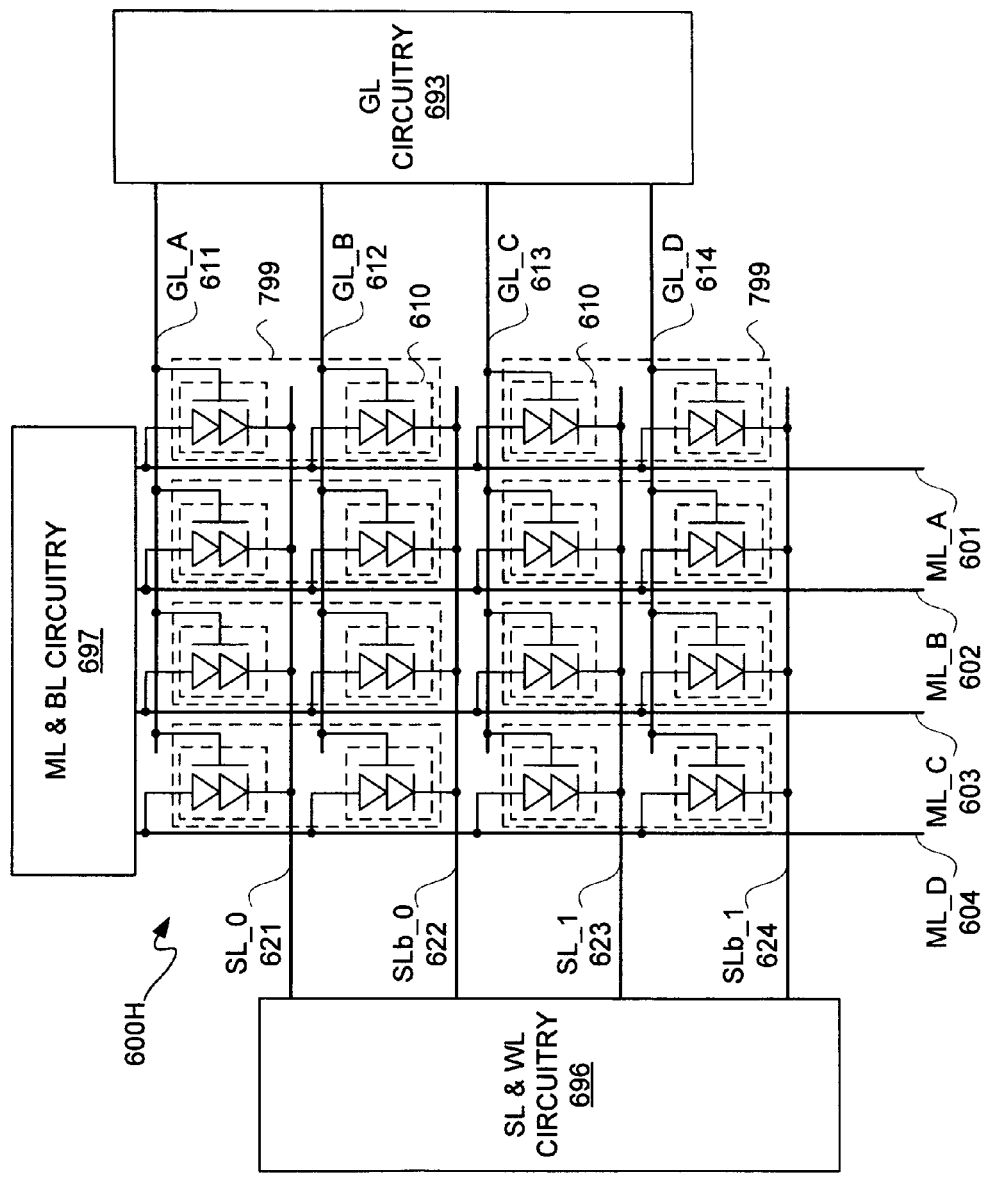
Figure 7H:
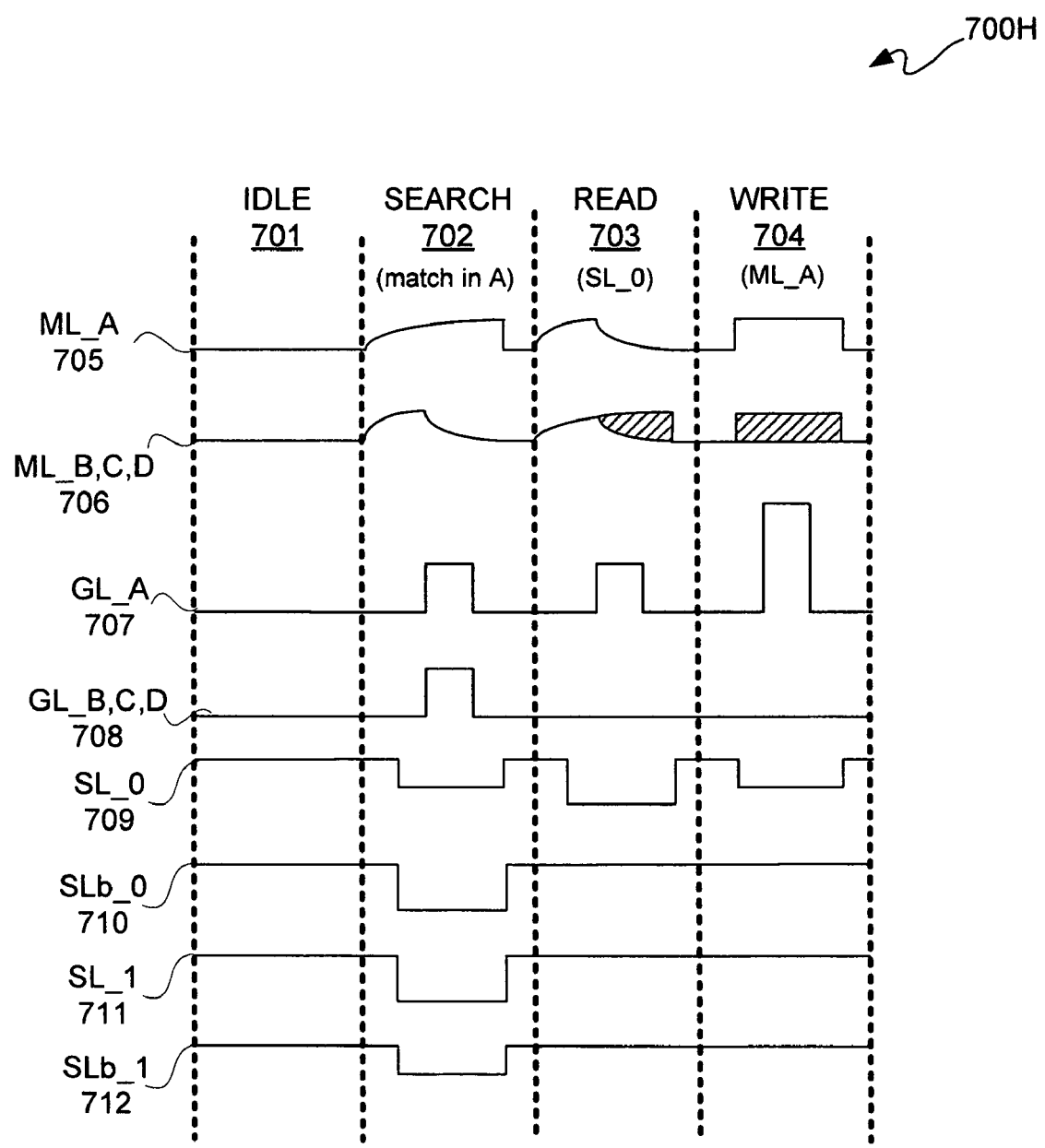

With reference to FIGS. 6H and 7H, cell array 600H and signal states 700H are described. In this embodiment, anodes of TCCT storage elements 610 are directly coupled to MLs 601 through 604, and SLs 621 through 624 are directly coupled to cathodes of TCCT storage elements 610. MLs 601 through 604 are orthogonal to GLs 611 through 614 as well as orthogonal to SLs 621 through 624. In this embodiment, MLs 601 through 604 are BLs during read operations. Accordingly, SLs 621 through 624 are used for WLs, or more particularly a selected WL, during a read operation. As previously described with reference to FIGS. 6G and 7G, SLs 621 through 624 are used as WLs or a selected WL during a write operation, and MLs 601 through 604 are used as BLs during a write operation. In this embodiment, coupled to MLs 601 through 604 is ML & BL circuitry block 697, and coupled to SLs 621 through 624 is SL and WL circuitry block 696. GLs 611 through 614 may be pulsed during a write operation and may or may not be pulse-kicked during search or read operations.

Voltage levels for idle state 701 are as previously described with reference to FIG. 7A, and thus are not repeated for purposes of clarity. Voltage levels for search state 702 are as previously described with reference to FIG. 7C, and thus are not repeated for purposes of clarity. Voltage levels for read state 703 are as previously described with reference to FIG. 7D, and thus are not repeated for purposes of clarity. Lastly, voltage levels for write state 704 are as previously described with reference to FIG. 7G, and thus are not repeated for purposes of clarity.

As there are eight embodiments, described with reference to FIGS. 6A through 6H, the preferred embodiment of such embodiments is that of FIG. 6A. It is preferred because it has relatively low search power consumption, relatively low external write circuit complexity and write power demand, relatively low refresh support circuitry complexity and refresh power demand, and relatively low read circuit complexity and read power demand.

Thus, with renewed reference to FIGS. 6A and 7A, search state 702 is further described. In this example, the logic values for SL signals 709 through 712 for search state 702 respectively are 0,1,1,0. As a match is in row A of cell array 600A, TCCT storage elements 610 of row A, which are illustratively shown in FIG. 6A as TCCT storage elements 610-1 through 610-4, have logic states 1,0,0,1 across the row for the example of four storage elements. It should be appreciated that TCCT storage elements only flow current in one direction. In this example, MLs are directly coupled to the cathodes of TCCT storage elements 610. Thus for this configuration, MLs are precharged to a logic low level, such as ground, or otherwise initialized low for search state 702, and pull-up voltage is through those TCCT cells which are in a conductive state, namely having a logic 1 stored. In contrast, if MLs were coupled to anodes of TCCT storage elements, then for a search mode, such MLs may be precharged or otherwise initialized to a logic high level and then pulled down through TCCT storage elements having stored therein logic highs.

Pulses 722 and 723 on GLs as respectively indicated by GL signaling 707 and 708 are kick pulses. These pulse kicks, like read kick pulse 726 applied to GL_A 611 as indicated by GL signaling 707, are used to assist TCCT storage elements associated with such GLs to turn on. Thus, if a logic 1 is stored in such TCCT storage element, such pulse kicking facilitates conductivity through such TCCT storage element having a logic 1 stored therein. Kick pulsing may be used to eliminate some disturb modes of TCCT cell arrays, as well as to enhance manufacturing yield.

For MLs 601 through 604 coupled to cathodes of TCCT storage elements 610 of cell array 600A, for there to be no appreciable affect on ML_A 601 as indicated by step 720 of ML signaling 705, logic states of the storage elements coupled to ML_A 601, namely storage elements 610-1 through 610-4, may be opposite in state to logic levels on associated SLs. For example with reference to storage element 610-4, a logic 1 stored therein means that such storage element is conductive from SL_0 621 to ML_A 601. However, because the logic value on SL_0 621 is a logic low, there is no significant increase in voltage on ML_A 601 through storage element 610-4, as ML_A 601 is precharged to a logic low level. Storage element 610-3 has stored therein a logic 0 and thus is nonconductive. Accordingly, the logic high level on SLb_0 622 is not conducted through to ML_A 601 via storage element 610-3. Along those lines, storage elements 610-1 and 610-2 respectively have logic states 1 and 0. Furthermore, it should be appreciated that if TCCT storage element 610-1 were written as a logic 0 in a ternary configuration, then the logic 1 on SLb_1 624 would be masked.

Assuming a match is obtained on ML_A 601, the actual data values stored in TCCT storage elements 610-1 through 610-4 may not be read out of CAM cells 699 associated therewith, but rather the address of the row associated therewith may be output. In other words, the matching row address may be output as opposed to the actual contents of the TCCT storage elements of such row for CAM operation.

Furthermore, it should be appreciated that MLs and SLs have dual functions, namely as either BLs or WLs. Such lines for a dynamic TCCT CAM cell array may be used to perform a read and writeback for a refresh cycle. As indicated by read state 703 as associated with a read of array 600A for example, the A row as indicated by GL signaling 707 may be to confirm that the correct values were written to such row, or to refresh such row as indicated here where the read of state 703 is followed by a write of state 704. Thus, pulses 730 and 731 respectively indicate the logic high values written back to TCCT storage elements 610-4 and 610-1, respectively, with TCCT storage elements 610-2 and 610-3 being written back with logic 0s as respectively indicated by SL signaling 710 and 711 for write state 704. Furthermore, it should be appreciated that reads may be generally parallel to writes in some configurations, and in other configurations reads may be generally orthogonal to the direction of writes.

For CAM Operation, all SLs and MLs may be toggled at the same time. This can cause a significant dynamic power consumption during search operations. However, by having smaller cell size, shorter lines may be used which reduces overall line capacitance. Furthermore, MLs and SLs need not swing to a full rail voltage level, or rail to rail. Such voltage swing has been described above for example with reference to FIG. 7A for example as being approximately less than 0.5 volts for detecting a miss.

As previously described, GLs may be pulse-kicked for TCAM implementations of TCCT cell arrays during search operations. However, such pulse-kicking of GLs during search operation increases drive current demands, which may be challenging for some negative voltage regulators. To address dynamic power consumption issues, bias conditions that allow for the elimination of GL pulse-kicking during search operations may be used. For example, with respect to FIGS. 6A and 7A, the 1 volt bias of MLs and SLs may be replaced with a 1.2 volt bias for all operations. This would allow GL pulse-kicking to be removed during search and read operations. Another alternative is to shift all operating voltage levels so that a negative voltage regulator, namely a negative charge pump, need not be implemented for operation of a TCCT cell array.

For example, with reference to FIG. 7A, all voltage levels may be shifted by +0.5 volts so, for example, GL voltage swings are between 0 and +0.5 volts during search operations.

With respect to bias conditions that allow elimination of GL pulse-kicking, for search or read operations (though search operations are more problematic, as many more rows are activated at a time than in a read operation), it should be appreciated that pulse-kicking of GLs causes TCCT storage elements to turn on quicker due to the higher potential. However, if bias conditions are raised, then TCCT storage elements may more rapidly conduct, and thus such pulse-kicking may be avoided.

GL pulse-kicking of TCCT storage elements 610 may be done at a frequency which is less than the search frequency. This is because once pulse-kicked, a TCCT storage element 610 is conditioned to relatively rapidly turn on for some period of time without having to be pulse-kicked again for such period of time. The amount of time between pulse-kicks may vary depending upon variations in fabrication of such TCCT storage elements 610. However, for consecutive search cycles, generally a first search cycle may be used to pulse-kick GLs and subsequent search cycles need not have their GLs pulse-kicked for one or more subsequent search cycles. For example, depending on the frequency of searching, GLs may be pulse-kicked once in every 10 to approximately 100 search cycles. This would allow current drive demands on a charge pump used to provide a negative supply voltage to be reduce, leading to a reduction in power consumption that may be linear with respect to the number of search cycles needing to be pulse-kicked.

Additionally, to conserve power, if it is observed that MLs are rising past a threshold for indicating that no match exists, such ML voltages for a subsequent search need not return to their idle state levels, but may be immediately precharged to the lower level. Thus, for example, if an ML was at 0.4 volts, it would not be returned to 1 volt for example with reference to FIG. 7A, but would be precharged back down to 0 volts from its 0.4 volt level to conserve power between successive search operations. Likewise, SLs having the same data states from one search operation to the next search operation, would merely maintain the prior state. Thus SLs for example at logic high voltage levels in FIG. 7A for one search operation may be held at those logic levels for an immediately subsequent search operation if such levels do not change from one search to the next. Again, this may be done to conserve power.

In short, between searches, arrays as described herein need not necessarily be brought back to idle state voltage levels with respect to SLs and MLs. With respect to GLs, a pulse-kick may be applied, and then such GLs may left alone for subsequent search cycles until a certain number of cycles have passed before issuing another pulse-kick.

Figure 8:
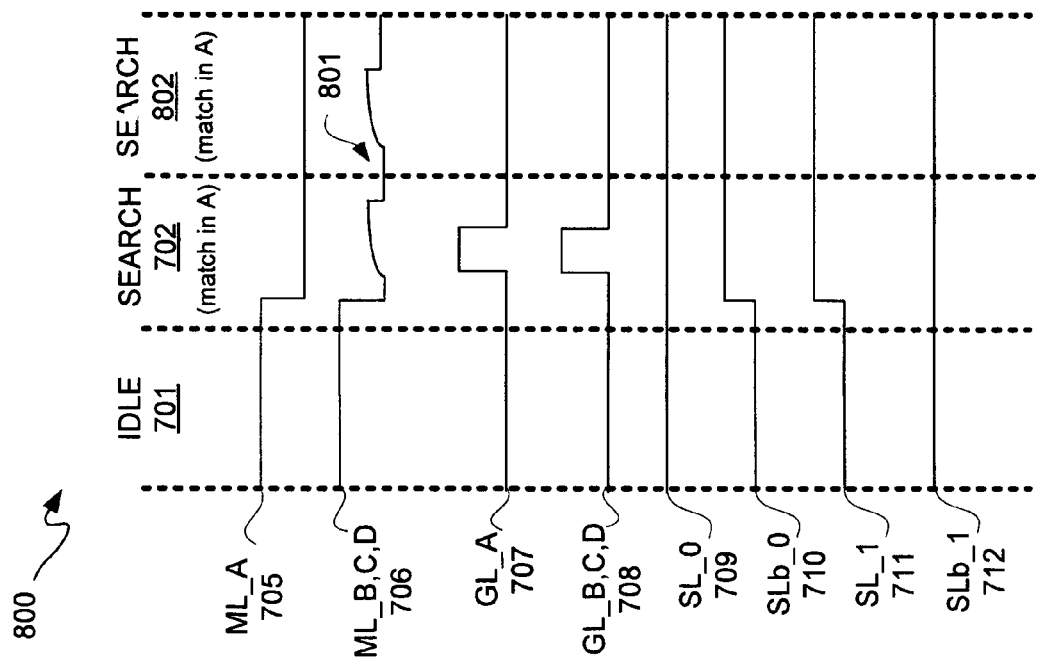
FIG. 8 is a signal state diagram depicting an exemplary embodiment of signal states for consecutive searches.

With reference to FIG. 8, there is shown a signal state diagram depicting an exemplary embodiment of signal states 800 for consecutive searches, as generally indicated by search state 802 immediately following search state 702 of FIG. 7A. For purposes of clarity by way of example and not limitation, it shall be assumed that the match is found in MLA 601 in both search states 702 and 802. Thus, the search data for search states 702 and 802 is the same as indicated by SL signaling 709 through 712 being at the same levels in both search states 702 and 802. As illustratively shown, between search states 702 and 802, ML signaling 70 does not return to an idle voltage level of idle state 701, but is precharged back down to a logic low voltage level, such as ground, as generally indicated at 801. Additionally, in search state 802, there is no pulse-kicking as generally indicated by the absence of such pulses for GL signaling 707 and 708 for such search state.

Figure 9:
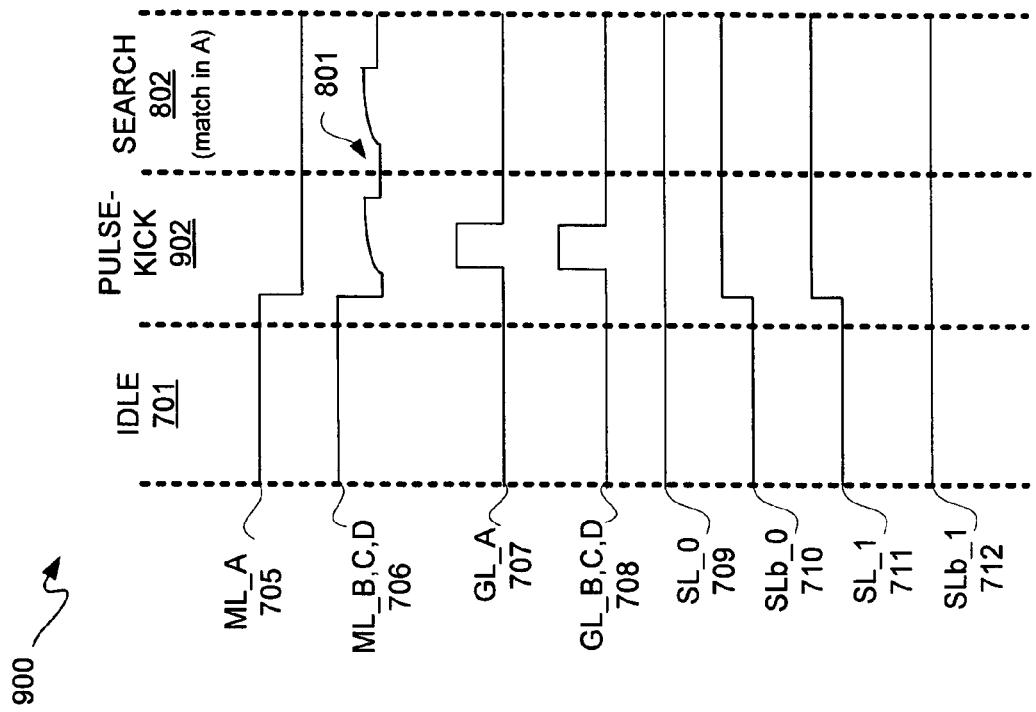
FIG. 9 is a signal state diagram depicting an exemplary embodiment of signal states for a kick state prior to a search state.

FIG. 9 is a signal state diagram depicting an exemplary embodiment of signal states 900. Signal states 900 include a pulse-kick state 902 between idle state 701 and search state 802. Pulse-kick state 902 is not for conducting a search, even though search data may be present on SLs at such time, but is merely a predefined time interval in which TCCT storage elements are pulse-kicked. Additionally, a search state may follow without pulse-kicking GLs, as generally indicated by GL signaling 707 and 708. It should be appreciated that by having predetermined pulse-kick states, an array of TCCT cells may be apportioned where only a portion of such storage elements is pulse-kicked during a pulse-kick state, such as pulse-kick state 902. Accordingly, for example, round robin circuitry may be used to sequence through sections of an array for pulse-kicking. Returning to the example of only pulse-kicking GLs once every so many cycles, it should be appreciated that an array may be divided up so that each portion is pulse-kicked within a number of cycles, but not having to have all such storage elements pulse-kicked at the same time. Hence, the peak dynamic power consumption may be reduced.

Accordingly, it should be appreciated that whether using a BiCAM or a TCAM, TCCT-based CAM arrays have smaller areas than both conventional SRAM-based, DRAM-based, and static TCCT-based CAMs. Furthermore, by reducing dynamic power consumption, array density may be increased. In other words, there may be more TCCT storage elements than in conventional. CAM arrays of equivalent dynamic power consumption.

Along those lines, FIG. 10 is a block diagram depicting an exemplary embodiment of a dynamic thyristor-based CAM array 1000. CAM array 1000 has ribs 1011 through 1014 coupled to pulse-kick circuitry 1001. Each of ribs 1011 through 1014 includes a number of MATs 1010. Pulse-kick circuitry 1001 may be respectively coupled to ribs 1011 through 1014 such that pulse-kicks may be individually applied to ribs 1011 through 1014 in a round robin sequence. Thus, only one, or some number less than all, of ribs 1011 through 1014 may be pulse-kicked at a time, which reduces dynamic power consumption in comparison with pulse-kicking all of such ribs at a time. Even though the example of ribs is used for apportioning an array for purposes of pulse-kicking, it should be appreciated that other divisions may be used.

CAM Architecture for Precomputation

Figure 11:
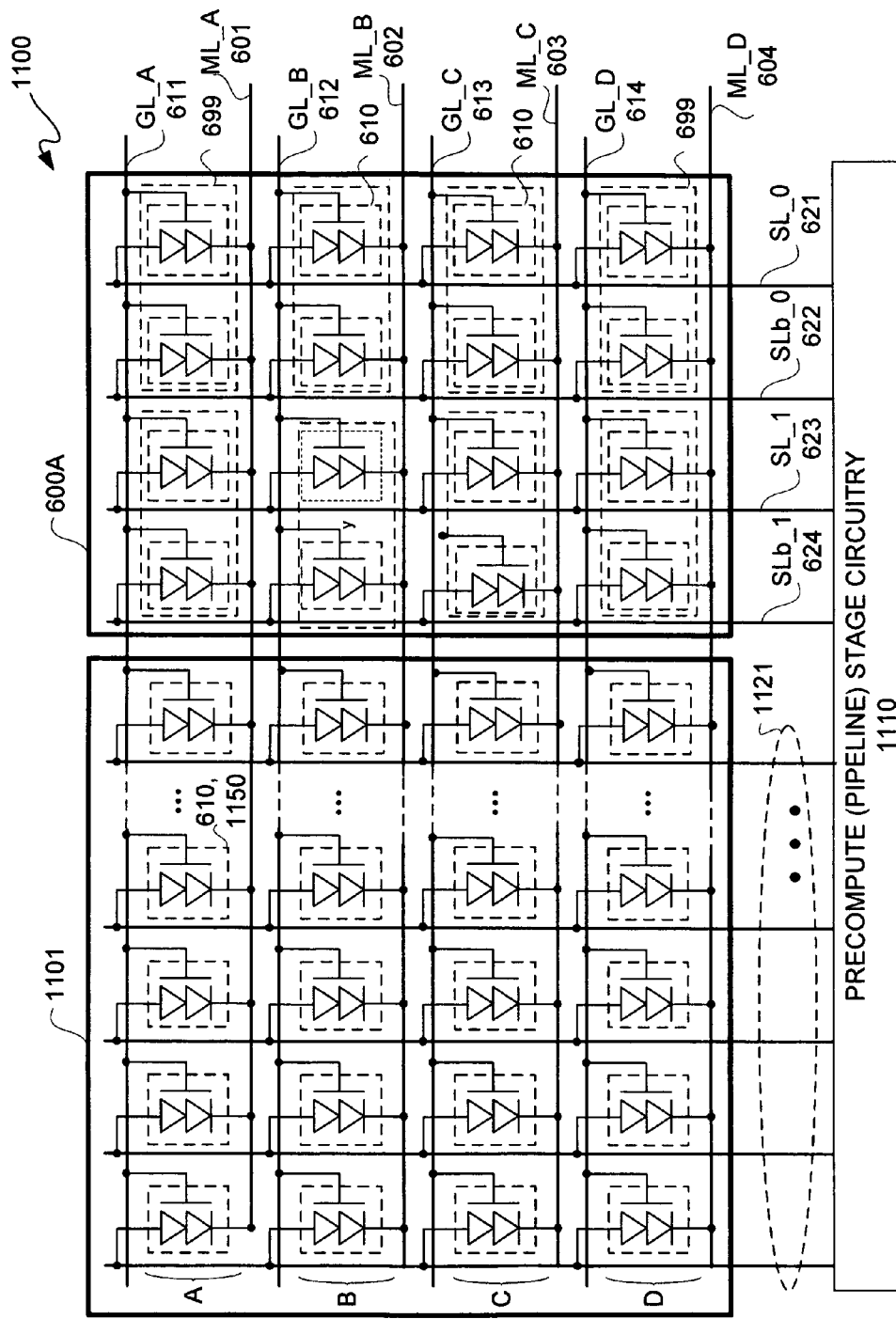
FIG. 11 is a block/circuit diagram depicting an exemplary embodiment of a precomputation-based CAM architecture.

FIG. 11 is a block/circuit diagram depicting an exemplary embodiment of a CAM architecture 1100. CAM architecture 1100 uses TCCT storage elements 610 in two cell arrays, namely cell array 1101 and cell array 600A. Even though cell array 600A of FIG. 6A is illustratively shown, it should be appreciated that any of cell arrays 600A through 600H as described herein may be used. Furthermore, corresponding to configuration of cell array 600A, cell array 1101 has TCCT storage elements 610 with anodes directly coupled to SLs 1121, cathodes directly coupled to MLs 601 though 604, and control gates directly coupled to GLs 611 through 614.

In rows, such as rows A through D of cell array 1101, match data, such as one or more match words, may be stored. It should be noted that each cell 1150 in cell array 1101 is a one TCCT storage element 610. In other words, there is one TCCT storage element 610 per CAM cell 1150 in cell array 1101.

Stored in rows of cell array 600A may be "precompute" values associated with match data, such as match words, stored in rows of cell array 1101. For example, a match word for row A of cell array 1101 may have three logic 1s. For this example, a value of "0011" may be stored in row A of cell array 600A to indicate that there are three logic 1s in the corresponding match word in row A of cell array 1101. Even though the example of logic 1s in a match word is used for determining a "precompute" value to store, it should be appreciated that other known types of encodings may be used for identification of the various forms of match data, including for example storing the number of logic 0s for each row of match data.

TCCT storage elements 610 are generally taller than they are wide. More particularly, TCCT storage elements 610 may be formed using a single metal pitch as generally indicated by columns of TCCT storage elements 610 disposed between SLs, such as SLs 1121 as associated with cell array 1101 and SLs 621 through 624 as associated with cell array 600A. Furthermore, it should be appreciated that there are multiple conductive lines, as generally indicated by GLs 611 through 614 and MLs 601 through 604 being located between TCCT storage elements 610. The relative number of such lines may generally cause cell arrays 1101 and 600A to have multiple metal pitches for each TCCT storage element 610, in this embodiment with respect to rows, in contrast to having single pitch formed TCCT storage elements 610, in this embodiment with respect to columns. Accordingly, relatively narrow cells 1150 facilitate MLs being relatively short for a significant number of TCCT storage elements 610 coupled thereto in comparison to cells having a wider footprint.

Because relatively shorter distance translates to relatively less line capacitance, the relative narrowness of cells 1150 facilitates having additional cells coupled to common MLs and GLs, for example. Thus, cells 1150 may facilitate adding cells 699 to MLs and GLs, for example, common with such cells 1150 due to relatively shorter distances translating to relatively less line capacitance. For example, common MLs 601 through 604 of cell arrays 1101 and 600A may be used. Furthermore, cell arrays 1101 and 600A may be formed with common GLs 611 through 614.

MLs 601 through 604 may be precharged, which in the example of FIG. 7A is to pull such MLs to a ground potential. Again, because MLs 601 through 604 may be relatively short for the number of cells 699 and 1150 directly coupled to them, there is less power used for such precharging. Furthermore, because MLs 601 through 604 are shorter, operation is faster.

Single-ended cells 1150 may be used provided other information is available. Thus, by having precompute values stored in differential cells 699 as associated with cell array 600A, cell array 1101 may be formed with single-ended cells 1150, namely using a single TCCT storage element 610 per cell 1150. Accordingly, there may be a substantial cell density increase for equivalent CAM cell area as compared with conventional CAMs.

A search word 1120 may be input to precompute stage circuitry 1110. Precompute stage circuitry 1110 may be a pipelined stage. Precompute stage circuitry 1110 may be configured to determine a precompute value. Such precompute value may be appended to search word 1120. Search word 1120 may be output from precompute stage circuitry 1110 on SLs 1121 along with the appended precompute value output on SLs 621 through 624 in this example.

As previously described with reference to FIGS. 6A and 7A, one or more MLs having matching match data with respect to search data have little or no potential increase thereon. Thus, a match as between search word 1120 with an appended precompute value and stored match data with an associated stored precompute value has little or no potential increase on an associated ML. Thus, for example, a match may be between one string of bits, such as formed of a match word and a precompute value respectively stored in association therewith in cell arrays 1101 and 600A, and another string of bits, such as formed of a search word and an appended precompute value respectively piped into cell arrays 1101 and 600A.

Figure 12:
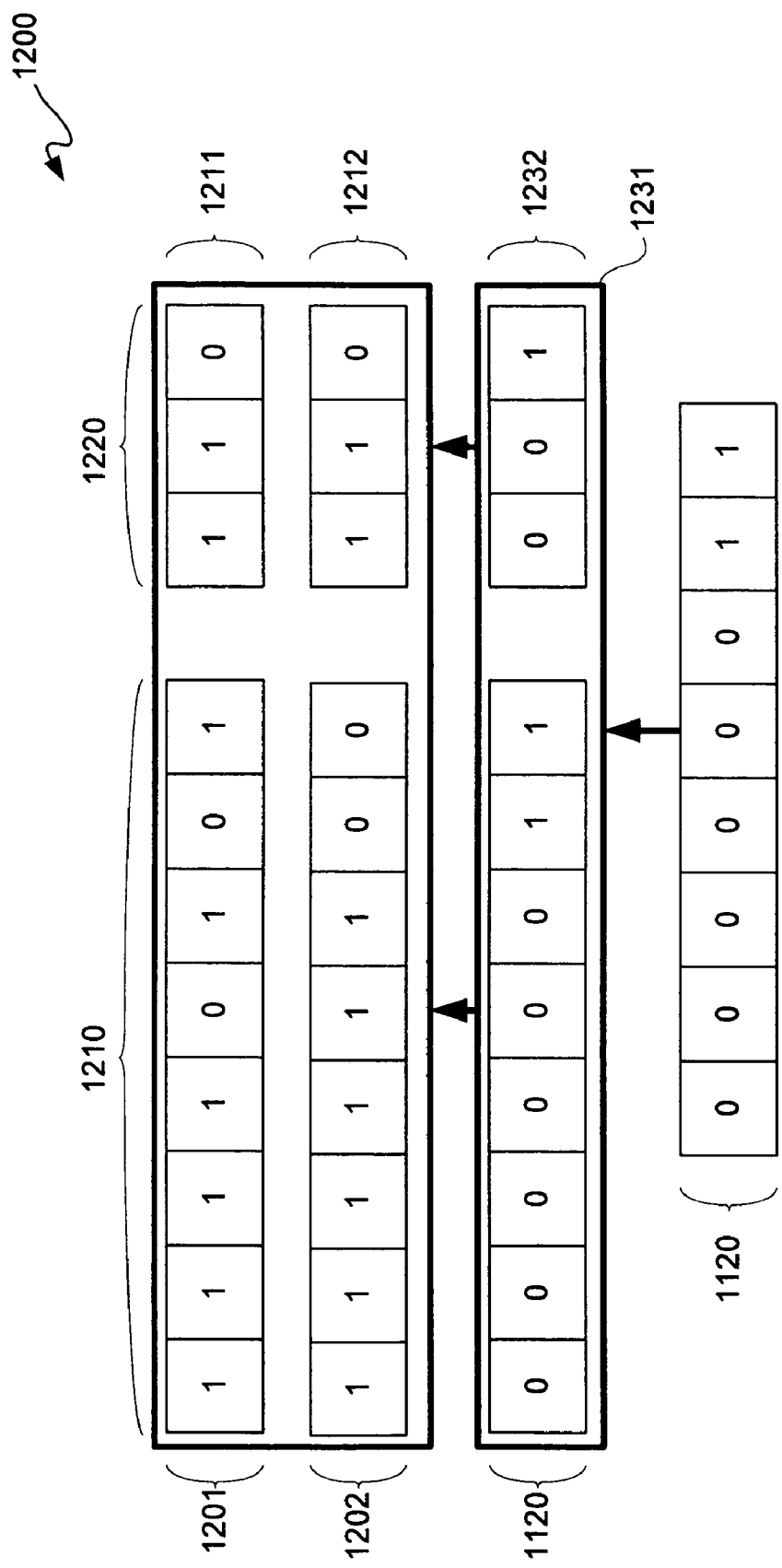
FIG. 12 is a data flow diagram depicting an exemplary embodiment of a search flow with precomputation.
Figure 13:
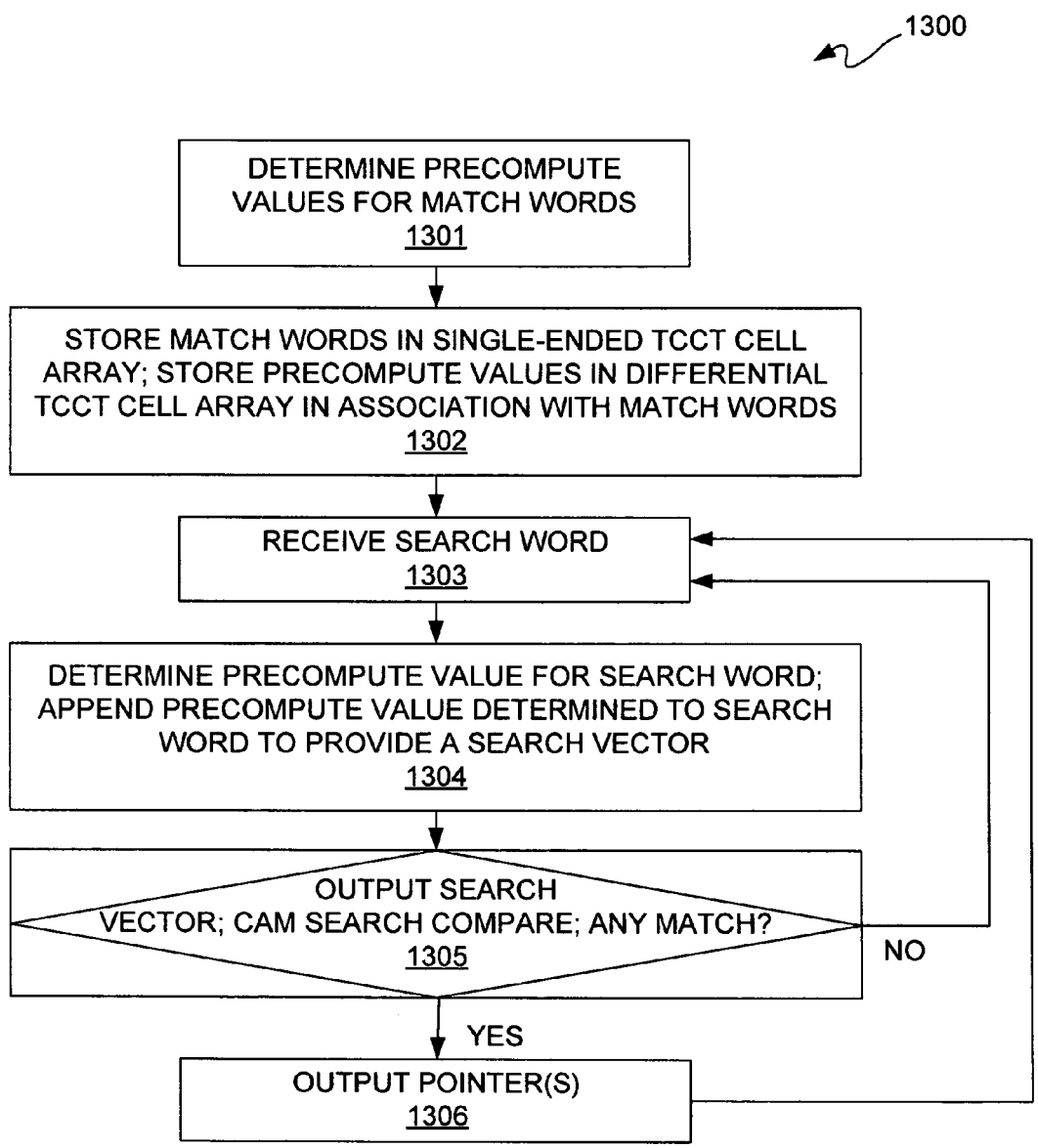
FIG. 13 is an operation flow diagram depicting an exemplary embodiment of an array conditioning and search flow.

FIG. 12 is a data flow diagram depicting an exemplary embodiment of a search flow 1200 with precomputation. FIG. 13 is an operation flow diagram depicting an exemplary embodiment of array conditioning and search flow 1300. Flows 1200 and 1300 may be used with CAM architecture 1100 of FIG. 11. With simultaneous reference to FIGS. 11 through 13, flows 1200 and 1300 are described in additional detail.

At 1301, precompute values 1220 for match words 1210 are determined. Thus for example, precompute values 1211 and 1212 may be respectively determined for each of match words 1201 and 1202 of match words 1210. The particular examples of logic 1s and 0s for match words and precompute values are for purposes of clarity by way of example and not limitation, and it should be appreciated that other values, as well as other numbers of match words and precompute values, may be used.

For match words 1210 in excess of 16 bits, though match words with as few as eight bits may be used, array area efficiency for a CAM may be enhanced. Thus, by having a positive integer n of precompute cells or bits associated with a positive integer m of match data cells or bits, where n is significantly smaller than m, may result in greater CAM array area efficiency, especially for m equal to or greater than 16.

At 1302, match words 1210 are stored in single-ended TCCT cell array 1101 in association with their precompute values 1220 determined at 1301 to provided stored match vectors. Precompute values 1220 determined at 1301 are stored in differential TCCT-based cell array 600A in association with their match words 1210 which are stored in single-ended TCCT-based cell array 1101. In short, match words 1201 and 1202 are respectively stored in association with precompute values 1211 and 1212 directly coupled to respective MLs in the example of FIG. 12.

At 1303, a search word 1120 is received. For example, search word 1120 may be received into precompute stage circuitry 1110. At 1304, a precompute value 1232 for search word 1120 is determined, and such determined precompute value 1232 is appended to search word 1120 received at 1303. In FIG. 12, a three bit precompute value, $2^3$, may be used to represent the possible numbers of logic 1s in an 8 bit search word. However, it should be understood that precompute bits may be scaled by a power of two to accommodate any number of search data bits.

Search word 1120 may be used to determine precompute value 1232. Search word 1120 may be appended with precompute value 1232 to provide a search vector 1231. Search vector 1231 may be output to SLs of CAM cell arrays at 1305. For example, search word 1120 may be output to SLs of cell array 1101, and precompute value 1232 may be output to SLs of cell array 600A. It should be appreciated that for each bit of precompute value 1232 there are two SLs which are used; however, for each bit of search word 1120 only one SL is used.

For this example, negative logic is used for determining whether a match exists, which is consistent with the example of cell array 600A. However, it should be appreciated that positive, rather than negative, logic may be used. For purposes of clarity by way of example and not limitation, in this example search word 1120 matches match word 1202 but does not match word 1201, namely for this example 00000011 is the inverse of 11111100 but not the inverse of 11110101. However, precompute values 1211 and 1212 respectively for match words 1201 and 1202 are the same, namely for this example both are 110, and thus both match precompute value 1232, namely for this example 001 which is the inverse of 110. Still, match word 1201 when compared against search word 1120 using negative logic is sufficiently mis-matched to cause a voltage rise on the associated ML sufficient to eliminate match word 1201 as a potential match.

At 1305, search word 1120 and appended precompute value 1232 are compared to match words 1210 and their associated precompute values 1220 stored at 1302, and it is determined whether there is any match. There may be more than one match. If there are no matches, a next search word is received at 1303. If, however, there is at least one match, then the one or more pointers associated with such one or more matches are output at 1306. After outputting pointers at 1306, a next search word may be received at 1303.

By having match data bits and precompute bits share a common ML, as well as potentially share a common GL, a BiCAM may be implemented. Furthermore, an array such as any of arrays 600A through 600H may be used as a TCAM, and array 1101 may be used as a BiCAM, and thus a hybrid CAM architecture, namely a BiTCAM architecture, may be used.

It should be appreciated that single-ended TCCT cells may be coupled on a same ML with differential TCCT cells, where the single-ended cells significantly outnumber the differential cells. Thus a search may be performed on both the single-ended and differential cells for MLs of an array. This may be done without differentiating which MLs to precharge, which allows for faster operation. However, if delay may be added, then a hierarchical approach indicating which MLs to pre-charge may be used for additional power savings as described in additional detail with reference to FIG. 14.

Figure 14:
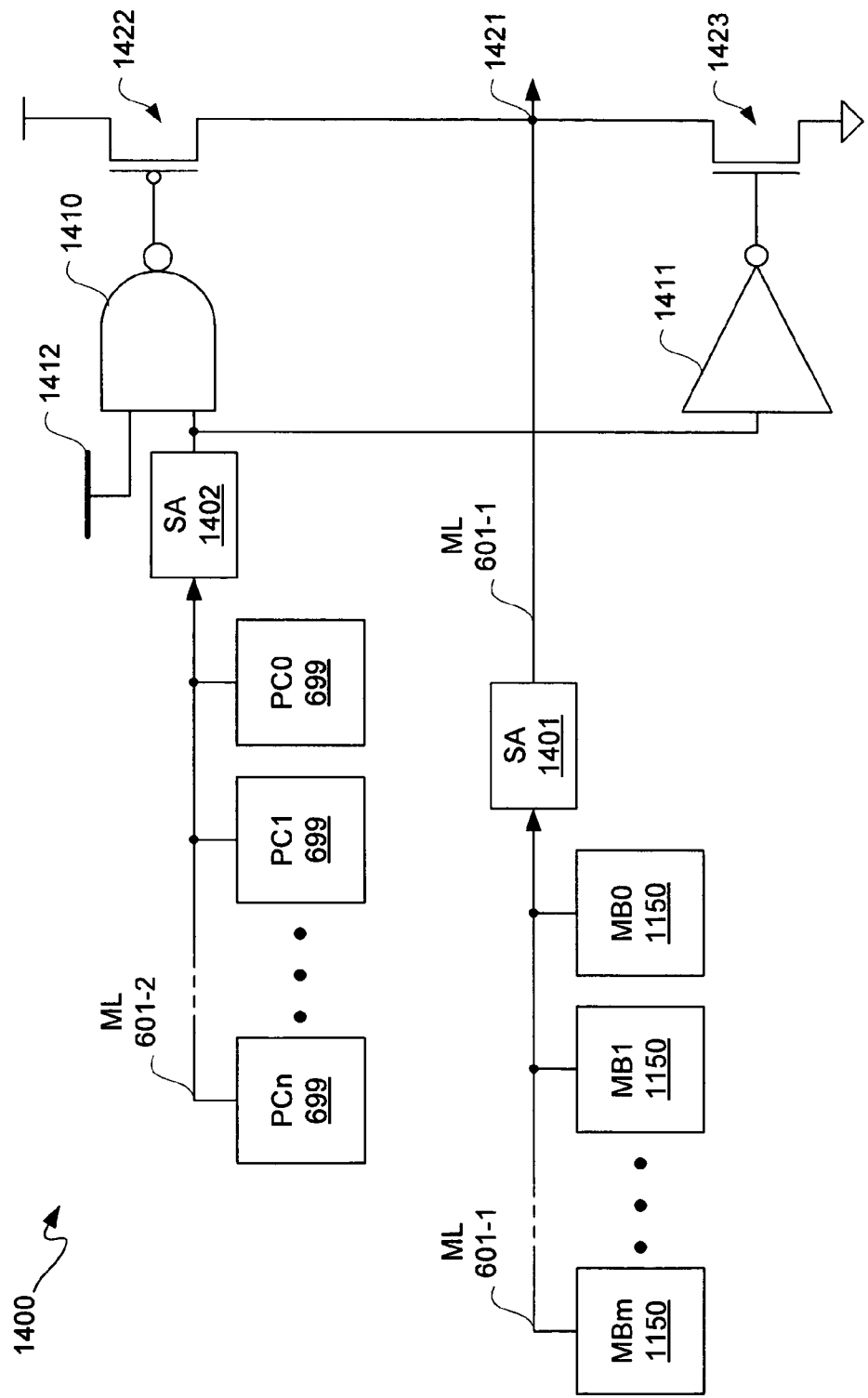
FIG. 14 is a block/circuit diagram depicting an exemplary embodiment of a hierarchical CAM architecture.

FIG. 14 is a block/circuit diagram depicting an exemplary embodiment of a hierarchical CAM architecture 1400. Pre-compute bits PC0 through PCn are implemented using differential TCCT-based cells 699. PC0 through PCn cells 699 have a common ML 601-2. ML 601-2 may be coupled to an input port of sense amplifier 1402, and output from sense amplifier 1402 responsive to voltage sensed on ML 610-2 may be provided as an input to NAND gate 1410. Another input to such NAND gate 1410 may be a precharge voltage level 1412.

ML 601-1 is common to MB0 through MBm cells 1150. Match word bits MB0 through MBm are stored in TCCT storage elements, namely single-ended cells 1150. Outputs of MB0 through MBm cells 1150 are provided to ML 601-1 for input to sense amplifier 1401 for sense amplification. Output of sense amplifier 1401 is provided to output node 1421, which is coupled in series with respective drain regions of P-channel FET 1422 and an N-channel FET 1423.

Output of sense amplifier 1402 is further provided as an input to inverter 1411. Outputs of NAND gate 1410 and inverter 1411 may be respectively provided to a push/pull driver, namely a P-channel FET 1422 and an N-channel FET 1423, respectively. Thus if a match is detected on ML 601-2, as indicated by the output of sense amplifier 1402, ML 601-1 is precharged.

Accordingly, to conserve power, ML 601-1 is only precharged if a precompute value associated with match data stored in MB0 through MBm cells 1150 is determined to match that stored in PC0 through PCn cells 699. Again, the number of precompute bits, PC0 through PCn, is significantly smaller than the number of match data bits, MB0 through MBm, as precompute bits may be scaled by a power of two to represent match data bits.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, while the above description has been for TCCT storage elements, it should be appreciated that other storage elements that are conductive in one state and nonconductive in another state like TCCT storage elements may be used. Furthermore, because there is no separate XOR circuitry associated with TCCT storage elements of a TCAM cell, a TCAM built with dynamic TCCT-based TCAM cells does not require that "true" and "complement" TCCT storage elements of a "bit" to be physically located adjacent to each other. For example, a dynamic TCCT-based TCAM array may be implemented with all the "true" TCCT storage elements for a matchword located on one side of the array and all the "complement" TCCT storage elements for the matchword located on another side of the array. Along those lines, a TCAM array architecture have circuitry for generating and driving lines, such as all SLbs, located together in a contiguous group along with having all the "complement" TCCT storage elements located contiguously on one side of such a TCAM array. Alternatively, there may be no ordering of TCCT storage elements at all, for example TCCT storage elements may even be located in an random order, in a TCAM array provided, however, that each of the TCCT storage elements of each pair forming a TCAM cell is associated with one another.

Claim(s) listing steps do not imply any order of the steps. Trademarks are the property of their respective owners.

What is claimed is:

1. A content addressable memory ("CAM") cell array, comprising:
   CAM cells;
   each of the CAM cells including two thyristor-based storage elements;
   each thyristor-based storage element of the CAM cells having a control gate, an anode, and a cathode for providing control gates, anodes, and cathodes of the CAM cells;
   matchlines directly coupled to the cathodes of the CAM cells;
   searchlines directly coupled to the anodes of the CAM cells; and
   gatelines coupled to the control gates of the CAM cells.

2. The CAM cell array according to claim 1, wherein:
   the matchlines and the searchlines are capable of being used as wordlines and bitlines for reads from and writes to the CAM cell array in a configuration selected from a group consisting of a first configuration, a second configuration, a third configuration, and a fourth configuration;
   the first configuration including:
      the matchlines being used as the wordlines and the searchlines being used as the bitlines for the reads from the CAM cell array; and
      the matchlines being used as the wordlines and the searchlines being used as the bitlines for the writes to the CAM cell array;

the second configuration including:
the matchlines being used as the bitlines and the searchlines being used as the wordlines for the reads from the CAM cell array; and
the matchlines being used as the bitlines and the searchlines being used as the wordlines for the writes to the CAM cell array;
the third configuration including:
the matchlines being used as the wordlines and the searchlines being used as the bitlines for the reads from the CAM cell array; and
the matchlines being used as the bitlines and the searchlines being used as the wordlines for the writes to the CAM cell array; and
the fourth configuration including:
the matchlines being used as the bitlines and the searchlines being used as the wordlines for the reads from the CAM cell array; and
the matchlines being used as the wordlines and the searchlines being used as the bitlines for the writes to the CAM cell array.

3. The CAM cell array according to claim 2, wherein for the first configuration and the fourth configuration:
the matchlines and the gatelines have at least approximately a parallel orientation with respect to one another; and
the searchlines have at least approximately an orthogonal orientation with respect to the matchlines.

4. The CAM cell array according to claim 2, wherein for the second configuration and the third configuration:
the searchlines and the gatelines have at least approximately a parallel orientation with respect to one another; and
the matchlines have at least approximately an orthogonal orientation with respect to the searchlines.

5. The CAM cell array according to claim 1, wherein the two thyristor-based storage elements of each of the CAM cells are paired for operation in a Ternary CAM.

6. The CAM cell array according to claim 5, wherein:
the two thyristor-based storage elements are programmable for differential data states and programmable for a same data state to provide masking capability without having to have a separate masking circuit;
the same data state including:
a first of the two thyristor-based storage elements programmed to provide a first high impedance path between a matchline of the matchlines and a first searchline of the searchlines;
the matchline and the first searchline being directly coupled to the first of the two thyristor-based storage elements;
a second of the two thyristor-based storage elements programmed to provide a second high impedance path between the matchline of the matchlines and a second searchline of the searchlines; and
the matchline and the second searchline being directly coupled to the second of the two thyristor-based storage elements.

7. The CAM cell array according to claim 1, wherein the CAM cell array is operable with matchline voltages on the matchlines for search operations from a precharge voltage level to approximately 50 percent of an idle state voltage level.

8. The CAM cell array according to claim 1, wherein the CAM cell array is operable with matchline voltages on the matchlines for search operations with a match voltage range of approximately 0 to 0.2 volts and a miss voltage range of approximately 0.4 to approximately 50 percent of an idle state voltage level, the idle state voltage level being approximately 1 volt.

9. The CAM cell array according to claim 1, wherein none of the CAM cells include an access field effect transistor.

10. A content addressable memory ("CAM") cell array, comprising:
CAM cells;
each of the CAM cells including two thyristor-based storage elements and not including an access field effect transistor;
each thyristor-based storage element of the CAM cells having a control gate, an anode, and a cathode for providing control gates, anodes, and cathodes of the CAM cells;
matchlines directly coupled to the anodes of the CAM cells;
searchlines directly coupled to the cathodes of the CAM cells; and
gatelines directly coupled to the control gates of the CAM cells.

11. The CAM cell array according to claim 10, wherein:
the matchlines and the searchlines are capable of being used as wordlines and bitlines for reads from and writes to the CAM cell array in a configuration selected from a group consisting of a first configuration, a second configuration, a third configuration, and a fourth configuration;
the first configuration including:
the matchlines being used as the wordlines and the searchlines being used as the bitlines for the reads from the CAM cell array; and
the matchlines being used as the wordlines and the searchlines being used as the bitlines for the writes to the CAM cell array;
the second configuration including:
the matchlines being used as the bitlines and the searchlines being used as the wordlines for the reads from the CAM cell array; and
the matchlines being used as the bitlines and the searchlines being used as the wordlines for the writes to the CAM cell array;
the third configuration including:
the matchlines being used as the wordlines and the searchlines being used as the bitlines for the reads from the CAM cell array; and
the matchlines being used as the bitlines and the searchlines being used as the wordlines for the writes to the CAM cell array; and
the fourth configuration including:
the matchlines being used as the bitlines and the searchlines being used as the wordlines for the reads from the CAM cell array; and
the matchlines being used as the wordlines and the searchlines being used as the bitlines for the writes to the CAM cell array.

12. The CAM cell array according to claim 11, wherein for the first configuration and the fourth configuration:
the matchlines and the gatelines have at least approximately a parallel orientation relative to one another; and
the searchlines have at least approximately an orthogonal orientation with respect to the matchlines.

13. The CAM cell array according to claim 11, wherein for the second configuration and the third configuration:
the searchlines and the gatelines have at least approximately a parallel orientation relative to one another; and the matchlines have at least approximately an orthogonal orientation with respect to the searchlines.

14. The CAM cell array according to claim 10, wherein the two thyristor-based storage elements of each of the CAM cells are paired for operation in a Ternary CAM.

15. The CAM cell array according to claim 14, wherein:
the two thyristor-based storage elements are programmable for differential data states and programmable for a same data state to provide masking capability without having to have a separate masking circuit;
the same data state including:
a first of the two thyristor-based storage elements programmed to provide a first high impedance path between a matchline of the matchlines and a first searchline of the searchlines;
the matchline and the first searchline being directly coupled to the first of the two thyristor-based storage elements;
a second of the two thyristor-based storage elements programmed to provide a second high impedance path between the matchline of the matchlines and a second searchline of the searchlines; and
the matchline and the second searchline being directly coupled to the second of the two thyristor-based storage elements.

16. A method for reducing power consumption of a content addressable memory ("CAM") cell array, comprising:
obtaining CAM cells;
the CAM cells including thyristor-based storage elements respectively having control gates coupled to a gateline;
performing consecutive search cycles of the CAM cells;
during a cycle of the consecutive search cycles, applying a pulse to the gateline for pulsing the thyristor-based storage elements coupled thereto; and
during a remainder of the consecutive search cycles after the cycle, not applying the pulse.

17. The method accordingly to claim 16, wherein the gateline is periodically pulsed once for every two or more of the consecutive search cycles.

18. The method accordingly to claim 17, wherein the gateline is periodically pulsed once for every 10 to 100 of the consecutive search cycles.

19. A memory device, comprising:
a first array of first memory cells;
each of the first memory cells having two thyristor-based storage elements;
the first memory cells being configured at least in part for differential operation;
a second array of second memory cells;
each of the second memory cells having a single thyristor-based storage element;
the second memory cells being configured for single-ended operation; and
the first array and the second array having matchlines in common; and
wherein a first portion of the first memory cells and a second portion of the second memory cells are both coupled to a same line.

20. The memory device according to claim 19, wherein:
the first array and the second array are for a content addressable memory ("CAM") for the memory device; and
the line is a matchline of the CAM.

21. The memory device according to claim 20, wherein:
the first array and the second array have searchlines and matchlines, the matchlines including the matchline;

the matchlines and the searchlines are used as wordlines and bitlines for reads from and writes to a CAM cell array;
the CAM cell array has the first array and the second array; and
the CAM cell array has a configuration selected from a group consisting of a first configuration, a second configuration, a third configuration, and a fourth configuration.

22. The memory device according to claim 21, wherein:
the first configuration includes:
the matchlines being used as the wordlines and the searchlines being used as the bitlines for the reads from the CAM cell array; and
the matchlines being used as the wordlines and the searchlines being used as the bitlines for the writes to the CAM cell array;
the second configuration includes:
the matchlines being used as the bitlines and the searchlines being used as the wordlines for the reads from the CAM cell array; and
the matchlines being used as the bitlines and the searchlines being used as the wordlines for the writes to the CAM cell array;
the third configuration includes:
the matchlines being used as the wordlines and the searchlines being used as the bitlines for the reads from the CAM cell array; and
the matchlines being used as the bitlines and the searchlines being used as the wordlines for the writes to the CAM cell array; and
the fourth configuration includes:
the matchlines being used as the bitlines and the searchlines being used as the wordlines for the reads from the CAM cell array; and
the matchlines being used as the wordlines and the searchlines being used as the bitlines for the writes to the CAM cell array.

23. The memory device according to claim 22, wherein:
the matchlines are coupled to cathodes of the first memory cells and the second memory cells; and
the searchlines are coupled to anodes of the first memory cells and the second memory cells.

24. The memory device according to claim 22, wherein:
the matchlines are coupled to anodes of the first memory cells and the second memory cells; and
the searchlines are coupled to cathodes of the first memory cells and the second memory cells.

25. A method for reducing peak dynamic power consumption of a content addressable memory cell array, comprising:
determining precompute values for match words;
storing the match words in a first array of single-ended thyristor-based storage elements;
storing the precompute values in a second array of differential thyristor-based storage elements in association with the match words for correspondence between the match words and the precompute values to provide stored vectors;
receiving a search word;
determining a precompute value for the search word;
appending the precompute value to the search word to provide a search vector;
searching the match words and the precompute values respectively stored in the first array and the second array using the search vector; and outputting a pointer responsive to a match between the search vector and a stored vector of the stored vectors.

26. A method for reducing power consumption of a content addressable memory cell array, comprising:

determining precompute values for match words;

storing the match words in a first array of single-ended thyristor-based storage elements;

storing the precompute values in a second array of differential thyristor-based storage elements in association with the match words for correspondence between the match words and the precompute values;

receiving a search word;

determining a precompute value for the search word;

searching the precompute values respectively stored the second array using the precompute value;

finding a match between the precompute value and at least one of the precompute values;

responsive to the match, precharging a matchline associated with a match word of the match words; and the match word associated with the at least one of the precompute values matching the precompute value.

27. A memory device, comprising:

a first array of first memory cells;

each of the first memory cells having two thyristor-based storage elements;

the first memory cells being configured at least in part for differential operation;

a second array of second memory cells;

each of the second memory cells having a single thyristor-based storage element;

the second memory cells being configured for single-ended operation; and the first array and the second array having a first matchline and a second matchline, respectively;

control circuitry coupled to the first matchline for obtaining a voltage therefrom; and the control circuitry configured to selectively precharge the second matchline responsive to the voltage obtained from the first matchline.

28. The memory device according to claim 27, wherein:

the first matchline is coupled to the control circuitry via a first sense amplifier; and the second matchline is coupled to an output node of the control circuitry via a second sense amplifier.

* * * * *